(12) United States Patent
Park et al.

(10) Patent No.: US 10,304,544 B2
(45) Date of Patent: May 28, 2019

(54) MEMORY DEVICE AND OPERATING METHOD THEREFOR

(71) Applicant: SK hynix Inc., Gyeonggi-do (KR)

(72) Inventors: Hee Joung Park, Seoul (KR); Kyeong Seung Kang, Gyeonggi-do (KR); Won Chul Shin, Seoul (KR); Dong Hyuk Chae, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/835,586

(22) Filed: Dec. 8, 2017

(65) Prior Publication Data

US 2018/0322929 A1 Nov. 8, 2018

(30) Foreign Application Priority Data

May 8, 2017 (KR) .................... 10-2017-0057573

(51) Int. Cl.
| | |
|---|---|
| *G11C 16/04* | (2006.01) |
| *G11C 16/26* | (2006.01) |
| *G11C 16/24* | (2006.01) |
| *G11C 11/56* | (2006.01) |
| *G11C 16/32* | (2006.01) |

(52) U.S. Cl.
CPC .......... *G11C 16/26* (2013.01); *G11C 11/5642* (2013.01); *G11C 16/24* (2013.01); *G11C 16/32* (2013.01); *G11C 2211/5642* (2013.01)

(58) Field of Classification Search
CPC ..... G11C 16/0483; G11C 16/10; G11C 16/26; G11C 11/5642; G11C 11/5628; G11C 16/3418; G11C 2211/5642; G11C 16/28; G11C 16/3459; G11C 16/3454; G11C 16/24; G11C 2211/5621
USPC ............ 365/185.22, 189.05, 185.25, 185.21, 365/185.17, 203, 185.03, 185.11, 185.18, 365/185.05, 185.12, 185.13, 185.33
See application file for complete search history.

(56) References Cited

U.S. PATENT DOCUMENTS

2011/0149652 A1* 6/2011 Lee .................... G11C 11/5628
365/185.11

FOREIGN PATENT DOCUMENTS

KR 1020100101896 9/2010
KR 1020160075064 6/2016

* cited by examiner

*Primary Examiner* — Thong Q Le
(74) *Attorney, Agent, or Firm* — IP & T Group LLP

(57) ABSTRACT

A memory device includes a plurality of memory cells, bit lines connected to the plurality of memory cells, and page buffers coupled to the plurality of memory cells through the bit lines, and performing a read operation on the plurality of memory cells, wherein each of the page buffers comprises: a first latch controlling a bit line precharge operation during the read operation; and a second latch storing a result of a first sensing operation and a result of a second sensing operation performed after the first sensing operation, wherein a value stored in the second latch is inverted when the result of the first sensing operation and the result of second sensing operation are different from each other during the second sensing operation.

20 Claims, 18 Drawing Sheets

MEMORY DEVICE AND OPERATING METHOD THEREFOR

CROSS-REFERENCE TO RELATED APPLICATION

The present application claims priority under 35 U.S.C. § 119(a) to Korean patent application number 10-2017-0057573, filed on May 8, 2017, the entire disclosure of which is herein incorporated by reference in its entirety.

BACKGROUND

Field of Invention

Various embodiments of the invention relate generally to a memory device and an operating method therefor, and more particularly, to a device for power noise reduction in a read operation of the memory device, and a read method therefor.

Description of Related Art

A memory device may include a plurality of memory cells coupled to a single word line, and each of the memory cells may be coupled to a page buffer through a bit line. By using the page buffer, data sensed from the memory cells may be temporarily stored, and the stored data may be output. In this manner, a read operation may be performed.

A read operation may include one or more sensing operations. A sensing operation may be performed on a plurality of memory cells coupled to a single word line at the same time during the read operation. However, a large amount of current may be consumed during the sensing operation of the plurality of memory cells. This large amount of current consumed may generate noise on an internal power voltage or an internal ground voltage of the memory device. However, such noise on the internal power voltage or the internal ground voltage may result in errors in the sensing operation which deteriorate the reliability of the memory device.

SUMMARY

Various embodiments are directed to a memory device with improved reliability and a method for operating the memory device.

According to an embodiment, a memory device may include a plurality of memory cells, bit lines connected to the plurality of memory cells, and page buffers coupled to the plurality of memory cells through the bit lines, and performing a read operation on the plurality of memory cells, wherein each of the page buffers comprises: a first latch controlling a bit line precharge operation during the read operation; and a second latch storing a result of a first sensing operation and a result of a second sensing operation performed after the first sensing operation, wherein a value stored in the second latch is inverted when the result of the first sensing operation and the result of second sensing operation are different from each other during the second sensing operation.

According to another embodiment, a memory device may include a plurality of memory cells, and page buffers performing a read operation on the plurality of memory cells, wherein each of the page buffers includes a latch storing a result of a first sensing operation and a result of a second sensing operation subsequent to the first sensing operation during the read operation, and wherein a target threshold voltage of the first sensing operation is greater than a target threshold voltage of the second sensing operation.

According to another embodiment, a method for operating a memory device may include precharging a bit line coupled to a memory cell, performing a first sensing operation on the memory cell and storing in a latch as a first value, a sensed value by the first sensing operation, and performing a second sensing operation on the memory cell and storing in the latch as a second value, a sensed value by the second sensing operation, wherein a value stored in the latch is inverted when the first value and the second value are different from each other during the second sensing operation.

DETAILED DESCRIPTION

Figure 1:
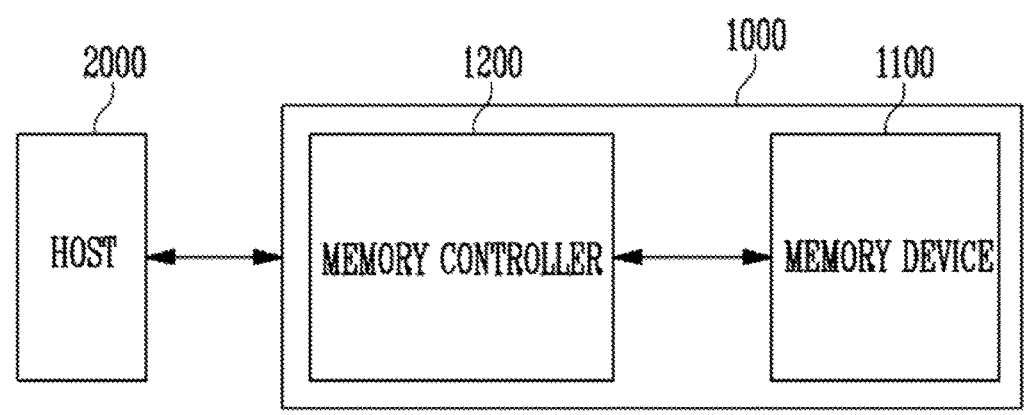
FIG. 1 is a diagram illustrating a memory system according to an embodiment.

Hereinafter, various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component.

FIG. 1 is a diagram illustrating a memory system 1000 according to an embodiment.

Referring to FIG. 1, the memory system 1000 may include a memory device 1100 for storing data and a memory controller 1200 controlling the memory device 1100 in response to control of a host 2000.

The host 2000 may communicate with the memory system 1000 using an interface protocol such as Peripheral Component Interconnect-Express (PCI-E), Advanced Technology Attachment (ATA), Serial ATA (SATA), Parallel ATA (PATA), or serial attached SCSI (SAS). However, interface protocols between the host 2000 and the memory system 1000 are not limited thereto. For example, other interface protocols, such as Universal Serial Bus (USB), Multi-Media Card (MMC), Enhanced Small Disk Interface (ESDI), or Integrated Drive Electronics (IDE) may also be used.

The memory controller 1200 may control the general operations of the memory system 1000 and control a data exchange between the host 2000 and the memory device 1100. For example, the memory controller 1200 may program or read data by controlling the memory device 1100 at the request of the host 2000. In addition, the memory controller 1200 may store information about main memory blocks and sub-memory blocks included in the memory device 1100 and select the memory device 1100 to perform a program operation on a main memory block or a sub-memory block according to the amount of data loaded for the program operation. According to an embodiment, the memory device 1100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), or FLASH Memory.

The memory controller 1200 may control the memory device 1100 to perform a program, read, or erase operation.

Figure 2:
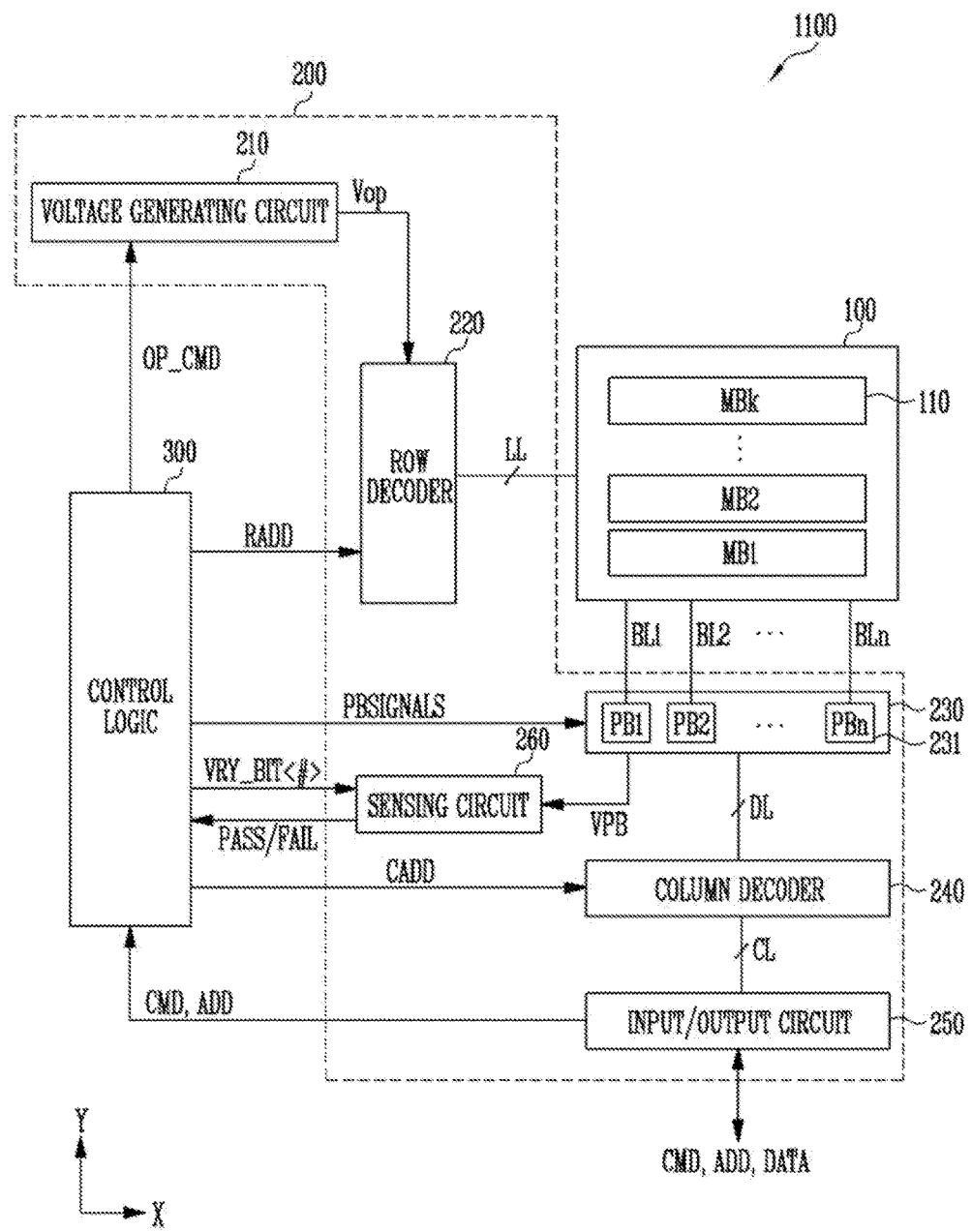
FIG. 2 is a diagram illustrating a memory device shown in FIG. 1.

FIG. 2 is a diagram illustrating the memory device 1100 shown in FIG. 1.

Referring to FIG. 2, the memory device 1100 may include a memory cell array 100 for storing data. The memory device 1100 may include peripheral circuits 200 configured to perform a program operation to store data in the memory cell array 100, a read operation to output the stored data, and an erase operation to erase the stored data. The memory device 1100 may include a control logic 300 configured to control the peripheral circuits 200 in response to control of the memory controller 1200 shown in FIG. 1.

The memory cell array 100 may include a plurality of memory blocks MB1 to MBk 110, where k is a positive integer. Local lines LL and bit lines BL1 to BLn may be coupled to the memory blocks MB1 to MBk 110, where n is a positive integer. For example, the local lines LL may include a first select line, a second select line, and a plurality of word lines arranged between the first and second select lines. In addition, the local lines LL may include dummy lines arranged between the first select line and the word lines and between the second select line and the word lines. The first select line may be a source select line and the second select line may be a drain select line. For example, the local lines LL may include word lines, drain and source select lines, and source lines. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. Each of the memory blocks MB1 to MBk 110 may have a two-dimensional or three-dimensional structure. For example, in the two-dimensional memory blocks 110, memory cells may be arranged in parallel with a substrate. For example, in the three-dimensional memory blocks 110, memory cells may be stacked in a vertical direction to the substrate.

The peripheral circuits 200 may be configured to perform program, read and erase operations on the selected memory block 110 in response to control of the control logic 300. For example, the control logic 300 may control the peripheral circuits 200 to supply a verify voltage and pass voltages to the first select line, the second select line and the word lines, selectively discharge the first select line, the second select line and the word lines, and verify memory cells coupled to a selected word line. For example, the peripheral circuits 200 may include a voltage generating circuit 210, a row decoder 220, a page buffer group 230, a column decoder 240, an input/output circuit 250 and a sensing circuit 260.

The voltage generating circuit 210 may generate various operating voltages Vop applied to perform program, read and erase operations in response to an operation signal OP_CMD. In addition, the voltage generating circuit 210 may selectively discharge the local lines LL in response to the operation signal OP_CMD. For example, the control logic 300 may control the voltage generating circuit 210 to generate a program voltage, a verify voltage, a pass voltages, a turn-on voltage, a read voltage, an erase voltage, and a source line voltage.

The row decoder 220 may transfer the operating voltages Vop to the local lines LL coupled to the selected memory block 110 in response to a row address RADD.

The buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or currents in the bit lines BL1 to BLn during a read or verify operation.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer the command CMD and the address ADD received from the memory controller 1200 shown in FIG. 1 to the control logic 300, or exchange data DATA with the column decoder 240.

The sensing circuit 260 may generate a reference current in response to an allowable bit VRY_BIT<#> and output a pass signal PASS or a fail signal FAIL by comparing a sensing voltage VPB received from the page buffer group 230 with a reference voltage generated by the reference current during a read operation or a verify operation.

The control logic 300 may control the peripheral circuits 200 by outputting the operation signal OP_CMD, the row address RADD, the page buffer control signals PBSIGNALS and the allowable bit VRY_BIT<#> in response to the command CMD and the address ADD. In addition, the control logic 300 may determine whether the verify operation passes or fails in response to the pass or fail signal PASS or FAIL.

Figure 3:
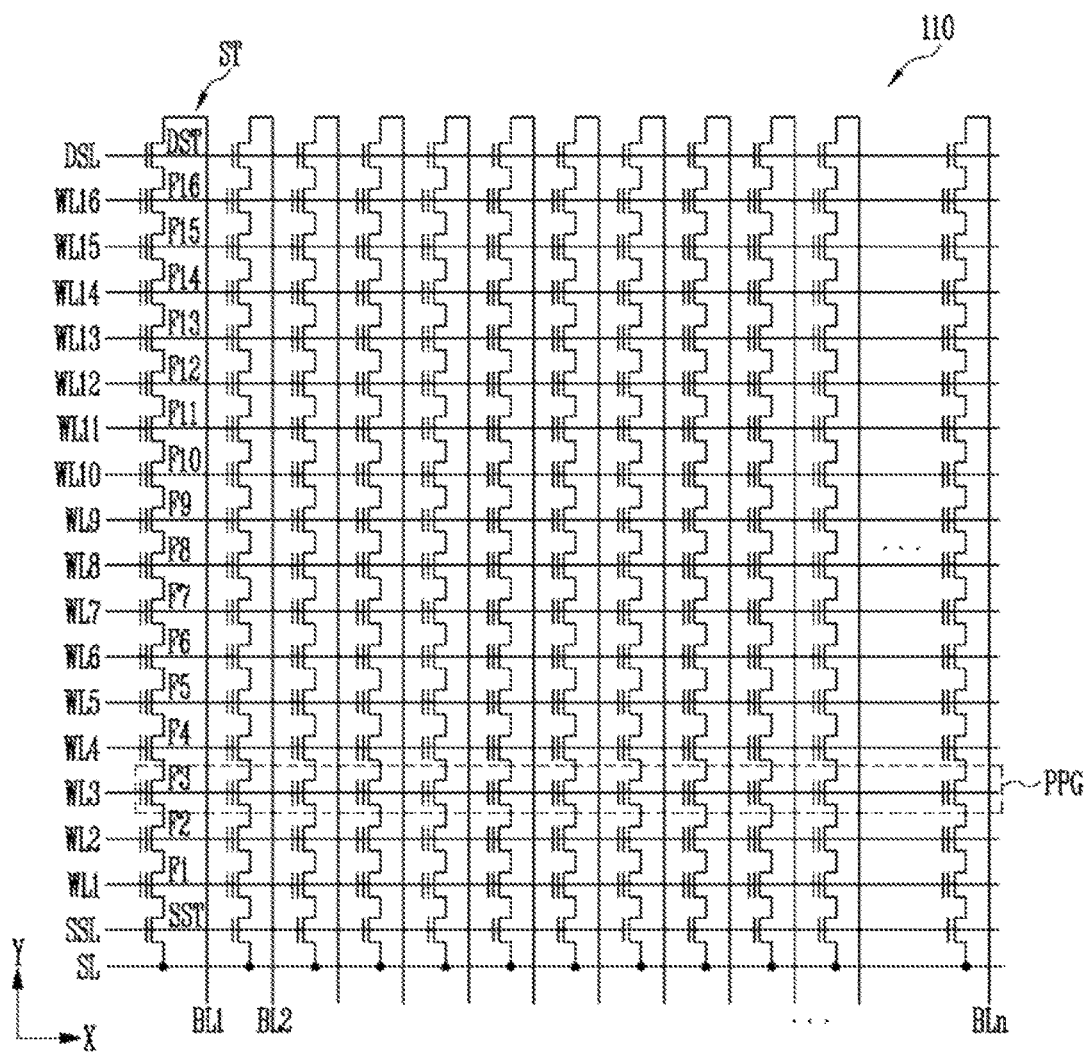
FIG. 3 is a diagram illustrating a memory block shown in FIG. 2.

FIG. 3 is a diagram illustrating the memory block 110 shown in FIG. 2.

Referring to FIG. 3, in the memory block 110, a plurality of word lines may be arranged in parallel with each other between the first select line and the second select line. The first select line may be a source select line SSL, and the second select line may be a drain select line DSL. More specifically, the memory block 110 may include a plurality of strings ST coupled between the bit lines BL1 to BLn and a source line SL. The bit lines BL1 to BLn may be coupled to the strings ST, respectively. The source line SL may be coupled in common to the strings ST. Since the plurality of strings ST may have the same configuration, the string ST coupled to the first bit line BL1 may be described in more detail as an example.

The string ST may include a source selection transistor SST, a plurality of memory cells F1 to F16 and a drain selection transistor DST which are coupled in series between the source line SL and the first bit line BL1. Each string ST may include at least one pair of the source selection transistor SST and the drain selection transistor DST. Furthermore, more memory cells than the memory cells F1 to F16 shown in FIG. 3 may be included.

A source of the source selection transistor SST may be coupled to the source line SL, and a drain of the drain selection transistor DST may be coupled to the first bit line BL1. The memory cells F1 to F16 may be coupled in series between the source selection transistor SST and the drain selection transistor DST. Gates of source selection transistors SST included in different strings ST may be coupled to the source select line SSL, and gates of drain selection transistors DST may be coupled to the drain select line DSL. Gates of the memory cells F1 to F16 may be coupled to the plurality of word lines WL1 to WL16. A group of memory cells coupled to the same word line, among memory cells included in different strings ST, may be referred to as a physical page PPG. Therefore, the memory block 110 may include as many physical pages PPG as the number of word lines WL1 to WL16.

One memory cell MC may store 1-bit data. Such memory cell is generally called a single level cell (SLC), and one physical page PPG may store data of one logical page (LPG). The data of the logical page LPG may include as many data bits as the number of memory cells included in one physical page PPG. In addition, one memory cell MC may store two or more bits of data. Such memory cell is called a multi-level cell (MLC), and one physical page PPG may store data of two or more logical pages LPG.

Figure 4:
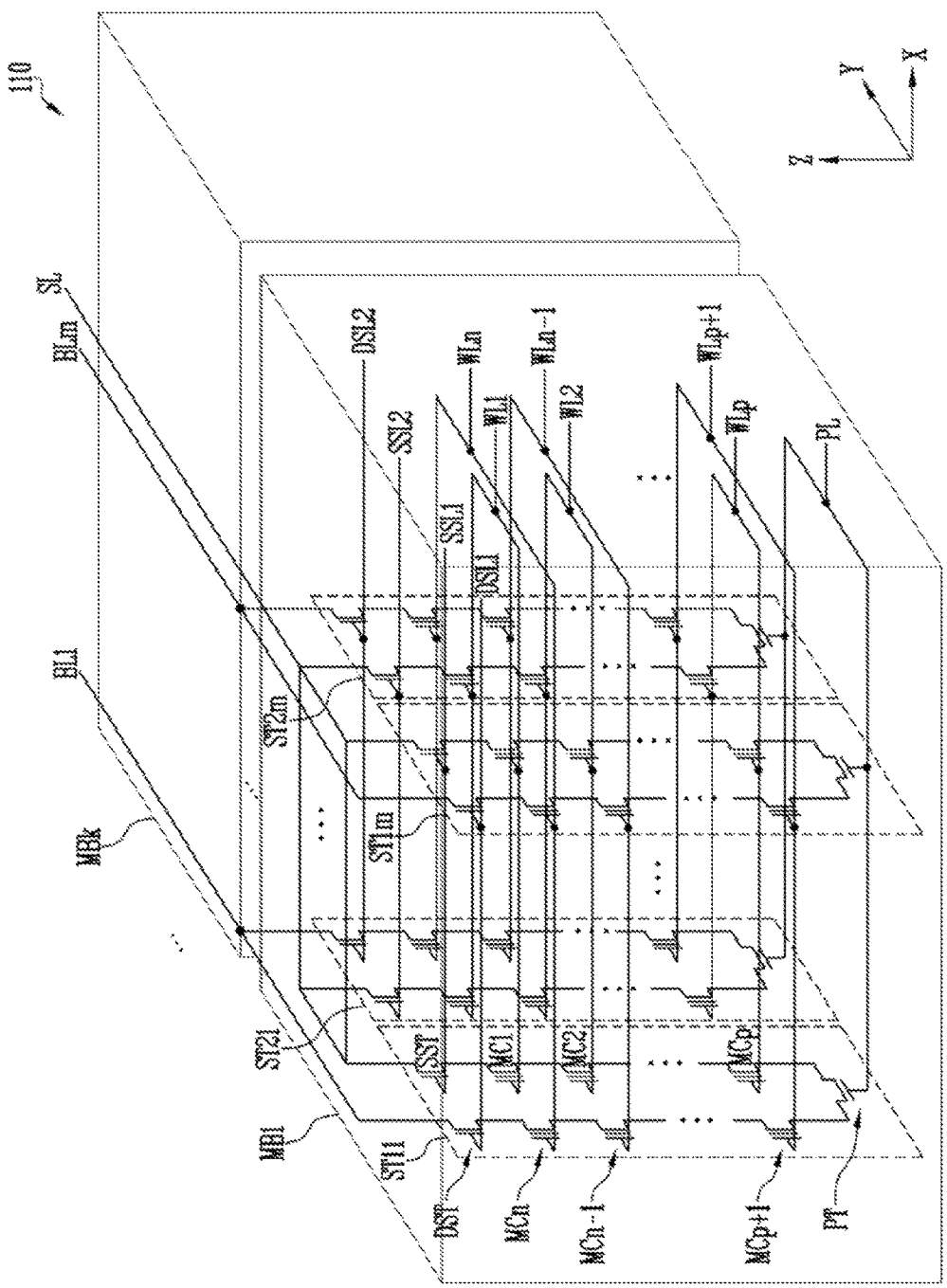
FIG. 4 is a diagram illustrating an embodiment of a three-dimensionally structured memory block.

FIG. 4 is a diagram illustrating an embodiment of a three-dimensionally structured memory block.

Referring to FIG. 4, the memory cell array 100 may include the plurality of memory blocks MB1 to MBk 110. The memory block 110 may include a plurality of strings ST11 to ST1m and ST21 to ST2m. According to an embodiment, each of the plurality of strings ST11 to ST1m and ST21 to ST2m may have a 'U' shape. In the first memory block MB1, 'm' strings may be arranged in a row direction (X direction). As shown in FIG. 4, for convenience of description, two strings may be arranged in a column direction (Y direction). However, three or more strings may be arranged in the column direction (Y direction).

Each of the plurality of strings ST11 to ST1m and ST21 to ST2m may include at least one source selection transistor SST, first to nth memory cells MC1 to MCn, a pipe transistor PT, and at least one drain selection transistor DST.

The source and drain selection transistors SST and DST and the memory cells MC1 to MCn may have similar structures to each other. For example, each of the source and drain selection transistors SST and DST and the memory cells MC1 to MCn may include a channel layer, a tunnel insulating layer, a charge trap layer and a blocking insulating layer. For example, a pillar for providing a channel layer may be formed in each string. For example, a pillar for providing at least one of the channel layer, the tunnel insulating layer, the charge trap layer and the blocking insulating layer may be formed in each string.

The source selection transistor SST of each string ST may be coupled between the source line SL and memory cells MC1 to MCp.

According to an embodiment, source selection transistors of strings arranged in the same row may be coupled to a source select line extending in a row direction, and source selection transistors of strings arranged in different rows may be coupled to different source select lines. As shown in FIG. 4, source selection transistors of the strings ST11 to ST1m in the first row may be coupled to a first source select line SSL1. Source selection transistors of the strings ST21 to ST2m in the second row may be coupled to a second source select line SSL2.

According to another embodiment, the source selection transistors of the strings ST11 to ST1m and ST21 to ST2m may be commonly coupled to one source select line.

The first to nth memory cells MC1 to MCn of each string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction) and be coupled in series between the source selection transistor SST and the pipe transistor PT. The (p+1)th to nth memory cells MCp+1 to MCn may be sequentially arranged in the vertical direction (Z direction) and coupled in series between the pipe transistor PT and the drain selection transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

According to an embodiment, at least one of the first to nth memory cells MC1 to MCn may serve as a dummy memory cell. When the dummy memory cell is provided, a voltage or current in the corresponding string may be stably controlled. A gate of the pipe transistor PT of each string may be coupled to a pipe line PL.

The drain selection transistor DST of each string may be coupled between a bit line and the memory cells MCp+1 to MCn. Strings arranged in a row direction may be coupled to a drain select line extending in the row direction. Drain selection transistors of the strings ST11 to ST1m in the first row may be coupled to a first drain select line DSL1. Drain selection transistors of the strings ST21 to ST2m in the second row may be coupled to a second drain select line DSL2.

Strings arranged in a column direction may be coupled to bit lines extending in a column direction. As illustrated in FIG. 4, the strings ST11 and ST21 in the first column may be coupled to the first bit line BL1. The strings ST1m and ST2m in the mth column may be coupled to an mth bit line BLm.

Memory cells coupled to the same word line, among strings arranged in the row direction, may form a single page. For example, memory cells coupled to the first word line WL1, among the strings ST11 to ST1m in the first row, may form a single page. Memory cells coupled to the first word line WL1, among the strings ST21 to ST2m in the second row, may form a single page. When one between the drain select lines DSL1 and DSL2 is selected, strings arranged in one row direction may be selected. When one of the word lines WL1 to WLn is selected, one page may be selected from the selected strings.

Figure 5:
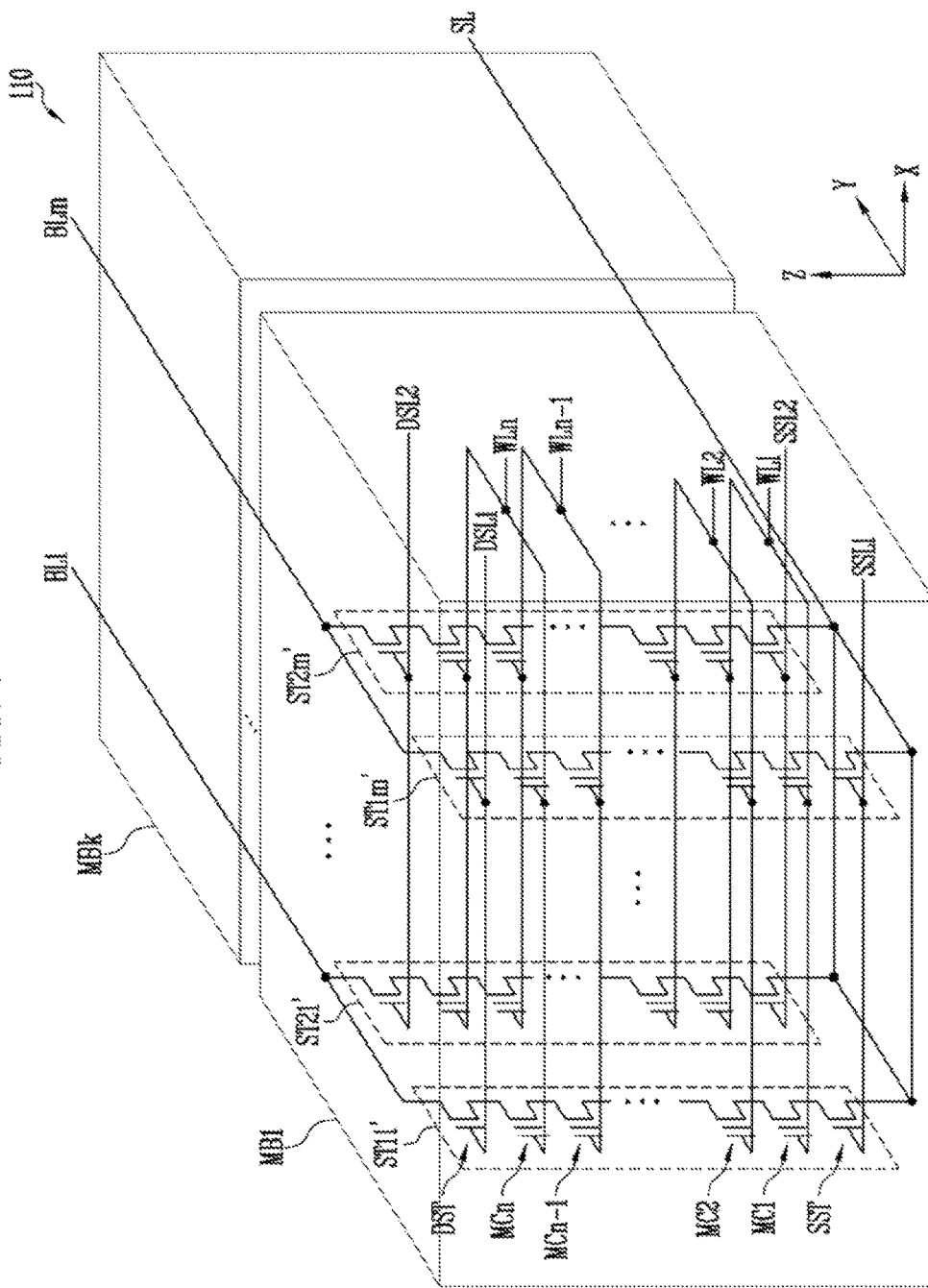
FIG. 5 is a diagram illustrating another embodiment of a three-dimensionally structured memory block.

FIG. 5 is a diagram illustrating an embodiment of a three-dimensionally structured memory block.

Referring to FIG. 5, the memory cell array 100 may include the plurality of memory blocks MB1 to MBk 110. The memory block 110 may include a plurality of strings ST11' to ST1m' and ST21' to ST2m'. Each of the plurality of strings ST11' to ST1m' and ST21' to ST2m' may extend in a vertical direction (Z direction). In the memory block 110, 'm' strings may be arranged in a row direction (X direction). As illustrated in FIG. 4, for convenience of description, two strings may be arranged in a column direction (Y direction). However, three or more strings may be arranged in the column direction (Y direction).

Each of the plurality of strings ST11' to ST1m' and ST21' to ST2m' may include at least one source selection transistor SST, first to nth memory cells MC1 to MCn, and at least one drain selection transistor DST.

The source selection transistor SST of each string may be coupled between the source line SL and the memory cells MC1 to MCn. Source selection transistors of strings arranged in the same row may be coupled to the same source select line. Source selection transistors of the strings ST11' to ST1m' in the first row may be coupled to the first source select line SSL1. Source selection transistors of the strings ST21' to ST2m' in the second row may be coupled to the second source select line SSL2. According to another embodiment, the source selection transistors of the strings ST11' to ST1m' and ST21' to ST2m' may be commonly coupled to a single source select line.

The first to nth memory cells MC1 to MCn of each string may be coupled in series between the source selection transistor SST and the drain selection transistor DST. Gates of the first to nth memory cells MC1 to MCn may be coupled to the first to nth word lines WL1 to WLn, respectively.

According to an embodiment, at least one of the first to nth memory cells MC1 to MCn may serve as a dummy memory cell. When the dummy memory cell is provided, a voltage or current in the corresponding string may be stably controlled. As a result, the reliability of data stored in the memory block 110 may be improved.

The drain selection transistor DST of each string may be coupled between the bit line and the memory cells MC1 to MCn. The drain selection transistors DST of strings arranged in the row direction may be coupled to a drain select line extending in the row direction. The drain selection transistors DST of the strings CS11' to CS1m' in the first row may be coupled to the first drain select line DSL1. The drain selection transistors DST of the strings CS21' to CS2m' in the second row may be coupled to the second drain select line DSL2.

That is, the memory block 110 shown in FIG. 5 may have a similar equivalent circuit to the memory block 110 shown in FIG. 4 except that the pipe transistor PT is removed from each string.

Figure 6:
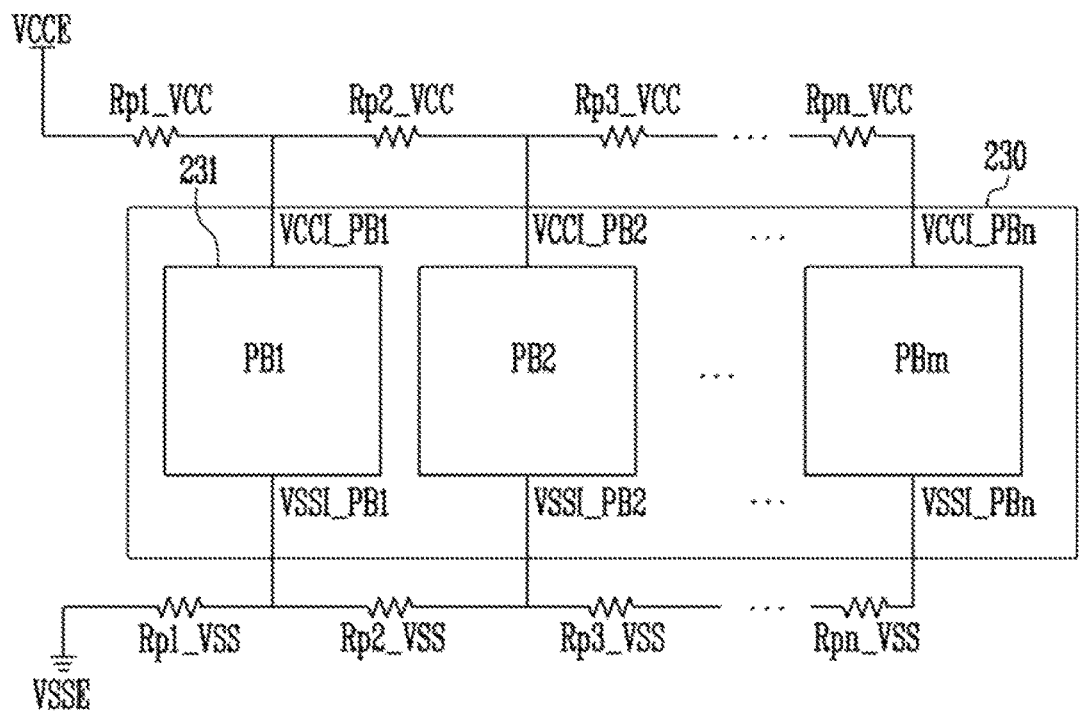
FIG. 6 is a diagram illustrating parasitic capacitances coupled to internal power voltages and an internal ground voltage of a page buffer.

FIG. 6 is a diagram illustrating parasitic resistances coupled to internal power voltages of page buffers and an internal ground voltage.

The memory device 1100 may receive an external power voltage VCCE from an external device. The external power voltage VCCE may be coupled to internal power voltages VCCI_PB1 to VCCI_PBn of the page buffers PB1 to PBn 231, respectively. A plurality of power voltage parasitic resistances Rp1_VCC to Rpn_VCC may exist between the external power voltage VCCE and the internal power voltages VCCI_PB1 to VCCI_PBn of the page buffers PB1 to PBn 231, respectively. The page buffers PB1 to PBn 231 may consume current during a read operation. However, when the current being consumed is supplied from the external power voltage VCCE to the internal power voltages VCCI_PB1 to VCCI_PBn, noise may occur in the internal power voltages VCCI_PB1 to VCCI_PBn due to the power voltage parasitic resistances Rp1_VCC to Rpn_VCC. As a result, the internal power voltages VCCI_PB1 to VCCI_PBn may be unstable. The unstable internal power voltages VCCI_PB1 to VCCI_PBn may cause errors in operations performed by the page buffers PB1 to PBn 231. As a result, the reliability of the memory device 1100 may be deteriorated.

The memory device 1100 may receive an external ground voltage VSSE from an external device. The external ground voltage VSSE may be coupled to internal ground voltages VSSI_PB1 to VSSI_PBn of the page buffers PB1 to PBn 231. A plurality of ground voltage parasitic resistances Rp1_VSS to Rpn_VSS may exist between the external ground voltage VSSE and the internal ground voltages VSSI_PB1 to VSSI_PBn of the page buffers PB1 to PBn 231, respectively. The page buffers PB1 to PBn 231 may consume current during a read operation. Noise may occur in the internal ground voltages VSSI_PB1 to VSSI_PBn due to the ground voltage parasitic resistances Rp1_VSS to Rpn_VSS when the current being consumed is supplied from the external ground voltage VSSE to the internal ground voltages VSSI_PB1 to VSSI_PBn. Thus, the internal ground voltages VSSI_PB1 to VSSI_PBn may be unstable. The unstable internal ground voltages VSSI_PB1 to VSSI_PBn may cause errors in operations performed by the page buffers PB1 to PBn 231. As a result, the stability of the memory device 1100 may be deteriorated.

Figure 7:
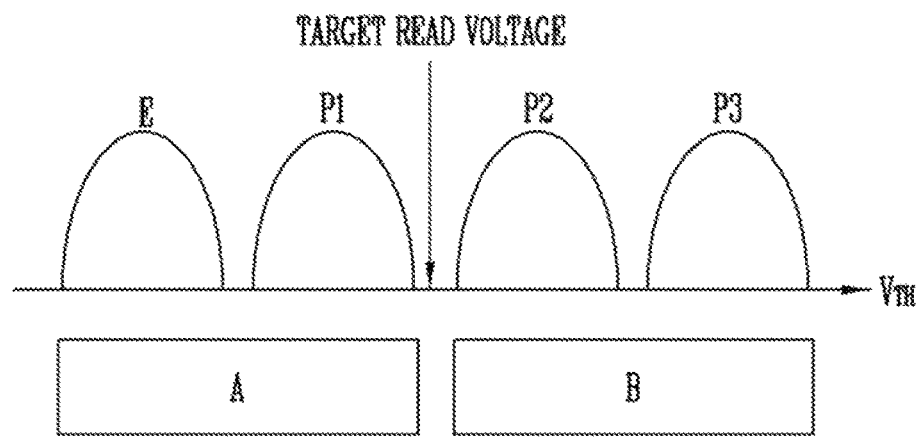
FIG. 7 is a diagram illustrating a conventional read operation method.

FIG. 7 is a diagram illustrating a conventional read operation method. FIG. 7 illustrates threshold voltage Vth distributions of memory cells MC included in one physical page PPG when each of the memory cells MC stores two-bit data.

Referring to FIG. 7, a threshold voltage of each of the memory cells MC may belong to one of an erase threshold voltage distribution E, a first program threshold voltage distribution P1, a second program threshold voltage distribution P2 and a third program threshold voltage distribution P3.

The memory device 1100 may perform a read operation by performing one sensing operation on the basis of a target read voltage. The target read voltage may be a target threshold voltage by which a memory cell is determined as an on-cell or an off-cell during a read operation. That is, the memory cells MC included in A-section where threshold voltages of the memory cell MC are less than the target read voltage may be determined as on-cells by a sensing operation to thereby output '1' as a data value. Furthermore, the memory cells MC included in B-section where threshold voltages thereof are greater than the target read voltage may be determined as off-cells by the sensing operation to output '0' as a data value. In addition, the target read voltage may be applied to a selected word line during the read operation.

The above-described read operation may be a normal read operation during which data programmed into the memory cells MC are read and output. The above-described read operation may be a program verification read operation and an erase verification read operation.

Figure 8:
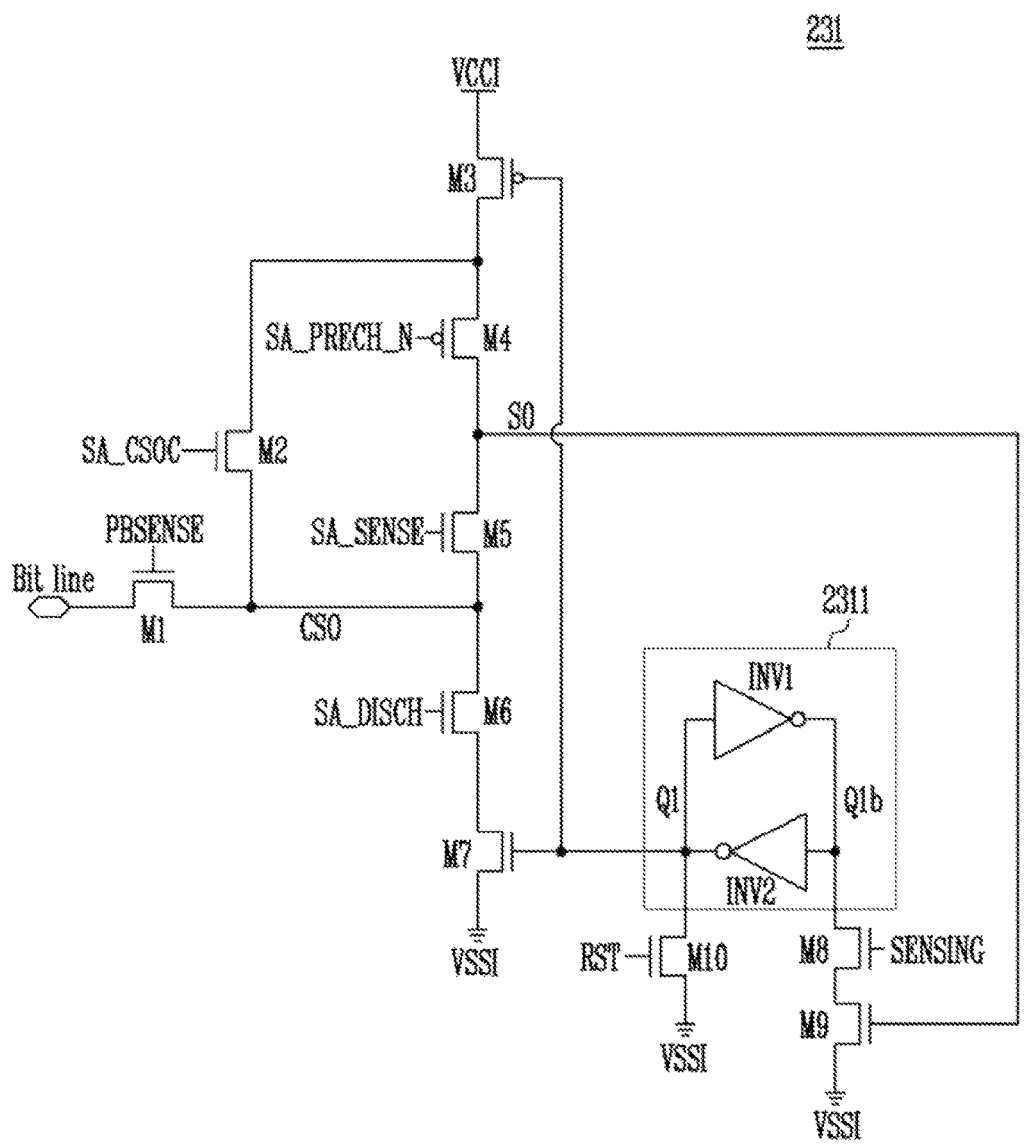
FIG. 8 is a diagram illustrating a conventional page buffer.
Figure 9:
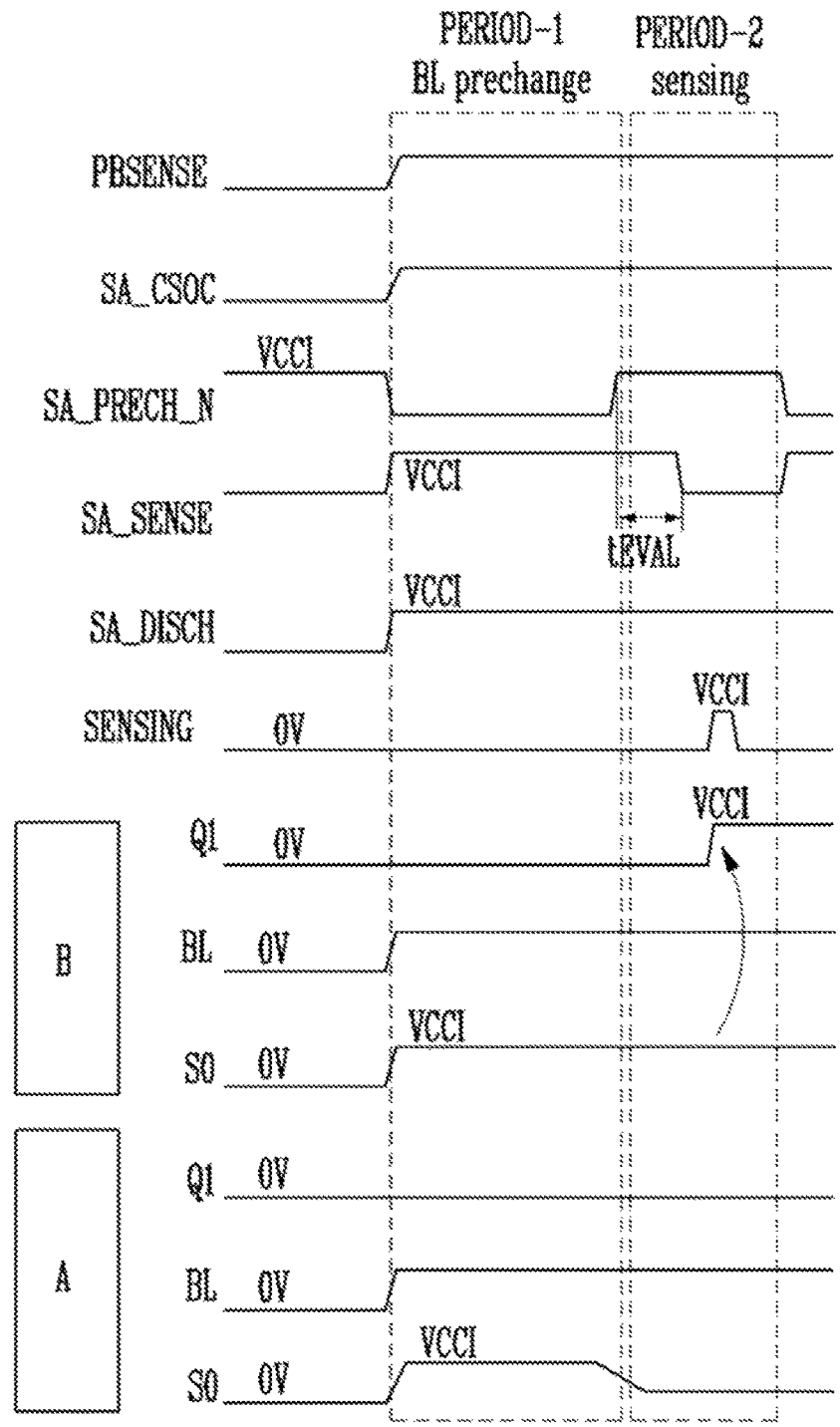
FIG. 9 is a timing diagram illustrating operations of a page buffer shown in FIG. 8 to perform a read operation shown in FIG. 7.

FIG. 8 is a diagram illustrating a conventional page buffer. FIG. 9 is a timing diagram illustrating operations of the page buffer 231 shown in FIG. 8 to perform the read operation shown in FIG. 7.

Referring to FIG. 8, the page buffer 231 may be coupled to the memory cell MC through the bit line and perform a bit line BL precharge operation so that charges supplied from the internal power voltage VCCI may be charged to the bit line through first, second, third, fourth, and fifth transistors M1, M2, M3, M4, and M5. The first transistor M1 may be controlled by a first sense signal PBSENSE, the second transistor M2 may be controlled by a first precharge signal SA_CSOC, and the third transistor M3 may be controlled by a first latch 2311. In addition, the fourth transistor M4 may be controlled by a second precharge signal SA_PRECH_N, and the fifth transistor M5 may be controlled by a second sense signal SA_SENSE.

In addition, the page buffer 231 may discharge the charges charged to the bit line to an internal ground voltage VSSI through the first transistor M1, a sixth transistor M6 and a seventh transistor M7. The sixth transistor M6 may be controlled by a first discharge signal SA_DISCH, and the seventh transistor M7 may be controlled by the first latch 2311.

The page buffer 231 may include the first latch 2311 including a first inverter INV1 and a second inverter INV2. The first latch 2311 may control a BL precharge operation by turning on or off the third transistor M3 through a first queue node Q1. A first queue bar node Q1b and the first queue node Q1 may have values inverted relative to each other. During a sensing operation of the memory cell MC, a voltage of a sense out node SO may be determined on the basis of a threshold voltage of the memory cell MC. The first latch 2311 may store a result of sensing the threshold voltage of the memory cell MC through a ninth transistor M9 coupled to the sense out node SO. The ninth transistor M9 may be an n-type MOS transistor, and the sense out node SO may be coupled to a gate node of the ninth transistor M9. Therefore, when the memory cell MC has a low threshold voltage, the sense out node SO may be at a low level and the ninth transistor M9 may be turned off. Furthermore, when the memory cell MC has a high threshold voltage, the sense out node SO may be at a high level and the ninth transistor M9 may be turned on.

The first inverter INV1 and the second inverter INV2 included in the first latch 2311 may be coupled to the internal power voltage VCCI and the internal ground voltage VSSI, respectively.

Referring to FIG. 9, a read operation of the memory device 1100 may include a BL precharge operation and a sensing operation subsequent to the BL precharge operation.

A tenth transistor M10 may be turned on for a short time before the bit line precharge operation starts. The tenth transistor M10 may be controlled by a reset signal RST. As a result, the first queue node Q1 may be set to a low level. During the bit line precharge operation, the first transistor M1, the second transistor M2, the third transistor M3, the fourth transistor M4 and the fifth transistor M5 may be turned on first to form a current path through which current may flow. Through the current path, current may be supplied from the internal power voltage VCCI to the bit line and the memory cell MC coupled to the bit line. The memory cells MC having the threshold voltages included in A-section as shown in FIG. 7 may be turned on. Thus, current may not flow through the memory cells in A-section. Moreover, the memory cells MC having the threshold voltages included in B-section of FIG. 7 may be turned off. Thus, current may not flow through the memory cells in B-section. The sense out node SO may maintain the internal power voltage VCCI during the bit line precharge operation since the third transistor M3 and the fourth transistor M4 are turned on.

After the bit line precharge operation is performed for a predetermined time, the fourth transistor M4 may be turned off and a sensing operation may start. When the fourth transistor M4 is turned off, the sense out node SO may be electrically disconnected from the internal power voltage VCCI. Charges charged to the sense out node SO of the page buffer 231 connected to the memory cell having the threshold voltage included in A-section of FIG. 7 may be discharged to the bit line through the current path formed via the first transistor M1 and the fifth transistor M5 during a sense evaluation period tEVAL. As a result, the voltage of the sense out node SO may be reduced to a voltage by which the ninth transistor M9 may not be turned on.

In addition, charges charged to the sense out node SO of the page buffer 231 connected to the memory cell having the threshold voltage included in B-section may not be charged to the bit line during the sense evaluation period tEVAL. As a result, the voltage of the sense out node SO may be maintained at the internal power voltage VCCI, or slightly reduced to a voltage by which the ninth transistor M9 may be turned on. That is, during the sense evaluation period tEVAL, the voltage of the sense out node SO may be determined by the threshold voltage of the memory cell. More specifically, when the memory cell has a higher threshold voltage, the sense out node SO may maintain a higher voltage, whereas when the memory cell has a lower threshold voltage, the sense out node SO may maintain a lower voltage.

When the fifth transistor M5 is turned off, the sense evaluation period tEVAL may end, the sense out node SO and the bit line may be electrically disconnected from each other, and the voltage of the sense out node SO when the sense evaluation period tEVAL ends may remain the same, regardless of the threshold voltage of the memory cell. Subsequently, a first sensing latch signal SENSING may be enabled for a short time, so that an eighth transistor M8 may be turned on. The ninth transistor M9 of the page buffer 231 coupled to the memory cell having the threshold voltage included in A-section of FIG. 7 may not be turned on by a voltage drop of the sense out node SO, and the first latch 2311 including the first inverter INV1 and the second inverter INV2 may maintain the previously stored value. That is, the first queue node Q1 may maintain the low value set during the bit line precharge operation.

The eighth transistor M8 of the page buffer 231 coupled to the memory cell having the threshold voltage included in B-section of FIG. 7 may be turned on, and the value stored in the first latch 2311 may be inverted. The low value of the first queue node Q1 set during the bit line precharge operation may be inverted to a high value. The first inverter INV1 and the second inverter INV2 of the first latch 2311 may also be coupled to the internal power voltage VCCI and the internal ground voltage VSSI, respectively. When the value of the first queue node Q1 of the first latch 2311 is inverted from low to high, a large amount of current may flow from the internal power voltage VCCI to the internal ground voltage VSSI. The flow of the large amount of current may cause the internal power voltage VCCI and the internal ground voltage VSSI to be unstable as described above. As a result, errors may occur in the read operation. For example, when a voltage level of the internal ground voltage VSSI coupled to a source node of the ninth transistor M9 increases, a threshold voltage of the ninth transistor M9 may be disturbed. As a result, errors may occur in a threshold voltage sensing operation of the memory cell MC. As the number of memory cells having threshold voltages included in B-section increases, values stored in more first latches 2311 may be inverted during a sensing operation. As a result, the internal power voltage VCCI and the internal ground voltage VSSI may be more unstable. That is, when the number of memory cells having threshold voltages included in B-section, errors may be more likely to occur in the read operation.

Figure 10:
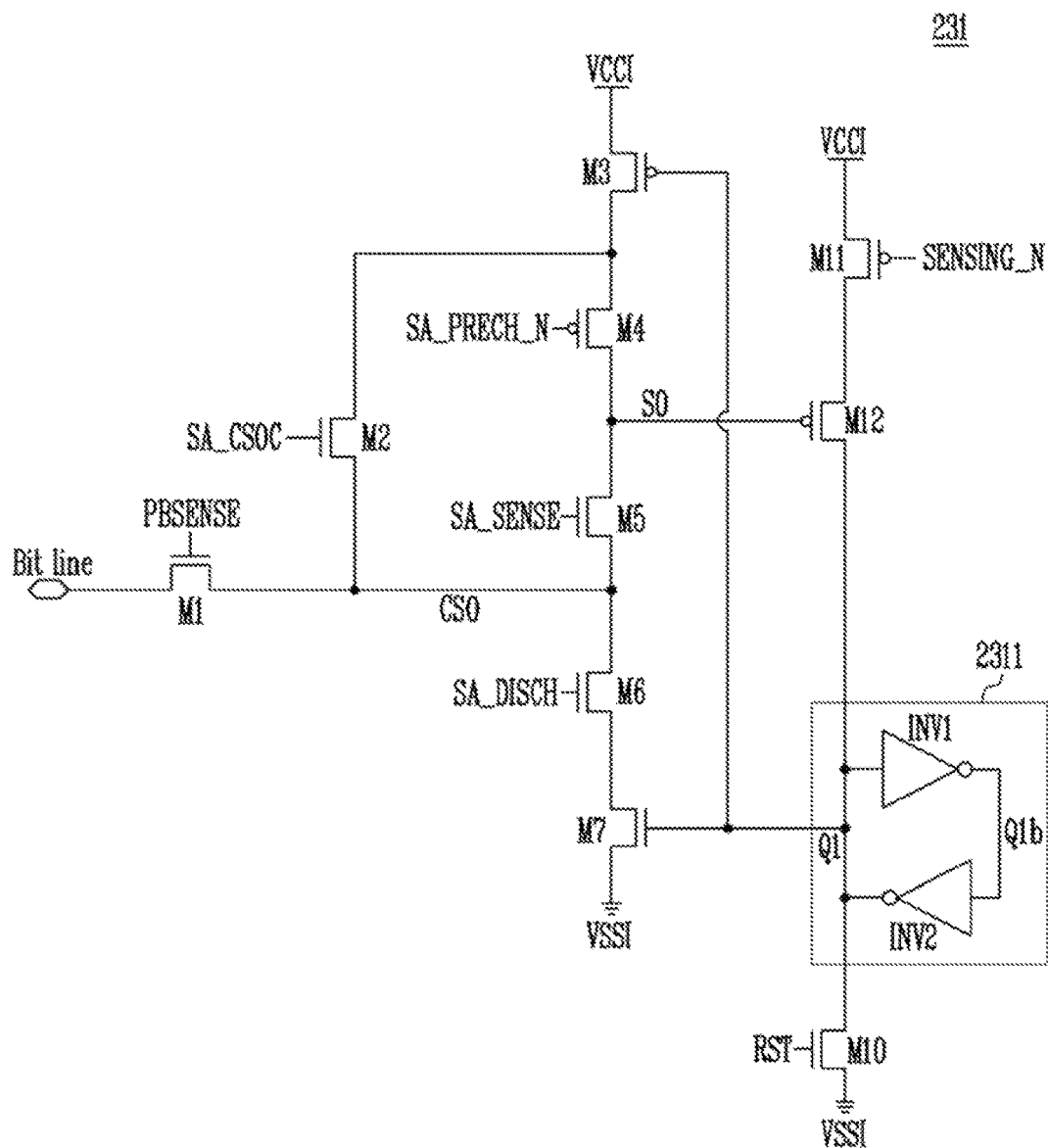
FIG. 10 is a diagram illustrating a conventional page buffer.
Figure 11:
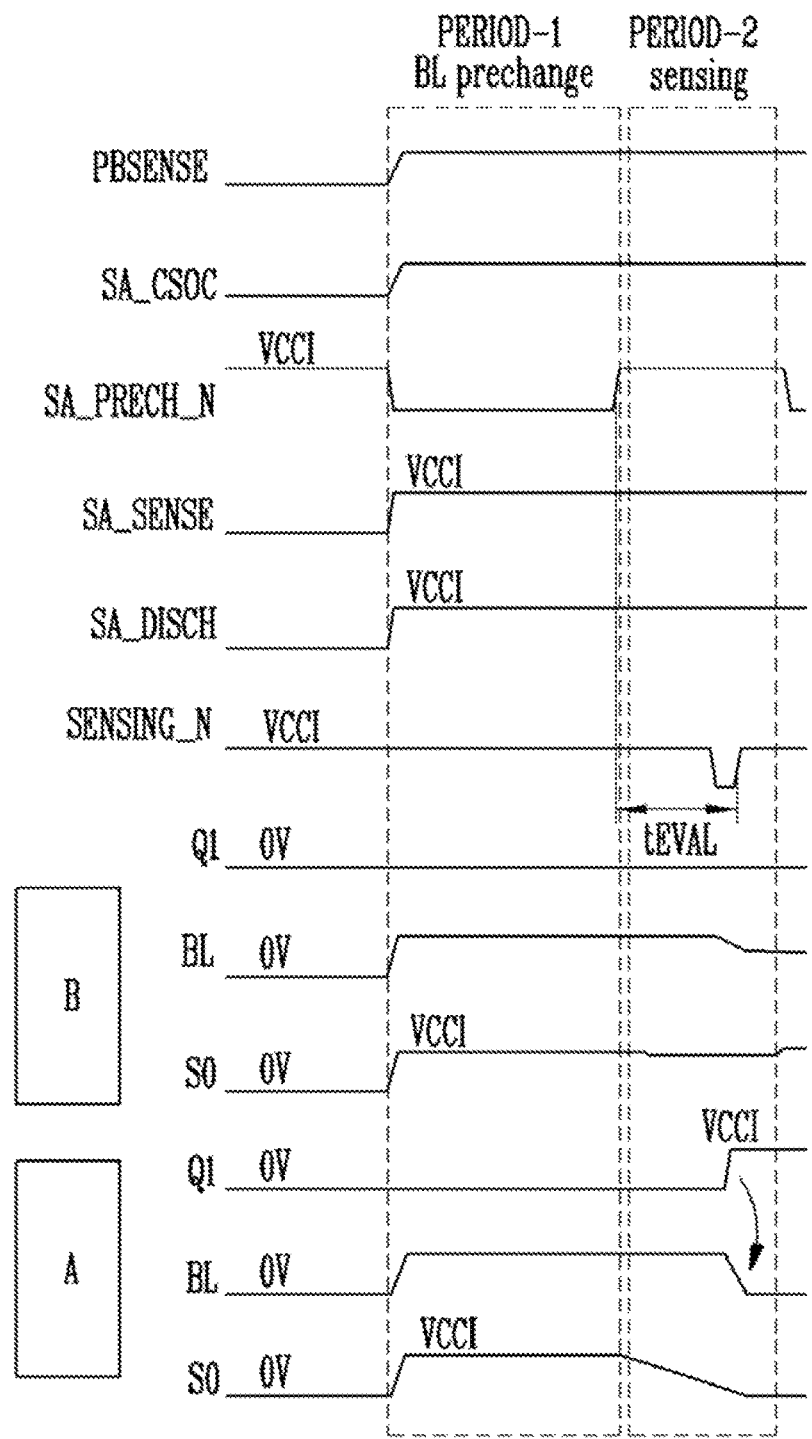
FIG. 11 is a timing diagram illustrating a page buffer shown in FIG. 10 to perform a read operation shown in FIG. 7.

FIG. 10 is a diagram illustrating a conventional page buffer. In addition, FIG. 11 is a timing diagram illustrating operations of the page buffer 231 shown in FIG. 10.

Referring to FIG. 10, the page buffer 231 may be coupled to the memory cell MC through the bit line and perform a BL precharge operation so that charges supplied from the internal power voltage VCCI may be charged to the bit line through the first to fifth transistors M1 to M5. The first transistor M1 may be controlled by the first sense signal PBSENSE, the second transistor M2 may be controlled by the first precharge signal SA_CSOC, and the third transistor M3 may be controlled by the first latch 2311. In addition, the fourth transistor M4 may be controlled by the second precharge signal SA_PRECH_N and the fifth transistor M5 may be controlled by the second sense signal SA_SENSE.

In addition, the page buffer 231 may discharge the charges charged to the bit line to the internal ground voltage VSSI through the first transistor M1, the sixth transistor M6 and the seventh transistor M7. The sixth transistor M6 may be controlled by the first discharge signal SA_DISCH, and the seventh transistor M7 may be controlled by the first latch 2311.

The page buffer 231 may be coupled to the memory cell MC through the bit line and perform the BL precharge operation so that the charges supplied from the internal power voltage VCCI may be supplied to the bit line through the first to fifth transistors M1 to M5. In addition, the page buffer 231 may discharge the charges charged to the bit line to the internal ground voltage VSSI through the first transistor M1, the sixth transistor M6 and the seventh transistor M7.

The page buffer 231 may include the first latch 2311 including the first inverter INV1 and the second inverter INV2. The first latch may control the BL precharge operation by turning on or off the third transistor M3 through the first queue node Q1. During a sensing operation of the memory cell MC, a voltage of the sense out node SO may be determined based on a threshold voltage of the memory cell MC. The first latch 2311 may store a result of sensing the threshold voltage of the memory cell MC through the twelfth transistor M12 coupled to the sense out node SO. The twelfth transistor M12 may be a p-type MOS transistor and the sense out node SO may be coupled to a gate node of the twelfth transistor M12. When the memory cell MC has a low threshold voltage, the sense out node SO may be at a low level during the sensing operation to turn on the twelfth transistor M12. When the memory cell MC has a high threshold voltage, the sense out node SO may be at a high level during the sensing operation to turn off the twelfth transistor M12.

The BL precharge operation shown in FIG. 11 may be performed in the same manner as described with reference to FIG. 9. After the bit line precharge operation is performed, the fourth transistor M4 may be turned off, a sense evaluation period tEVAL may start, and the voltage of the sense out node SO may be changed based on the threshold voltage of the memory cell MC during the sense evaluation period tEVAL. The eleventh transistor M11 may be turned on for a short time after the fourth transistor M4 is turned off, and whether the twelfth transistor M12 is turned on or off may be determined by the voltage of the sense out node SO. The eleventh transistor M11 may be controlled by a second sensing signal SENSING_N.

The first inverter INV1 and the second inverter INV2 included in the first latch 2311 may be coupled to the internal power voltage VCCI and the internal ground voltage VSSI, respectively.

Referring to FIG. 11, a sensing operation may start by turning off the fourth transistor M4 after the bit line precharge operation is performed. During the sense evaluation period tEVAL, the voltage of the sense out node SO of the page buffer 231 corresponding to the memory cell having the threshold voltage included in A-section shown in FIG. 7 may be reduced to a voltage by which the twelfth transistor M12 is turned on. As a result, a value stored in the first latch 2311 may be inverted. In addition, during the sense evaluation period tEVAL, the voltage of the sense out node SO of the page buffer 231 corresponding to the memory cell having the threshold voltage included in B-section shown in FIG. 7 may be maintained or be reduced slightly to a voltage by which the twelfth transistor M12 is turned off. As a result, the previously stored value in the first latch 2311 may be maintained. As for the page buffer 231 shown in FIG. 10, when the number of memory cells included in A-section shown in FIG. 7 increases, values stored in more first latches 2311 may be inverted. As a result, the internal power voltage VCCI and the internal ground voltage VSSI may be more unstable during the sensing operation. The sense evaluation period tEVAL may last until a turn-on period of the eleventh transistor M11 ends.

Figure 12:
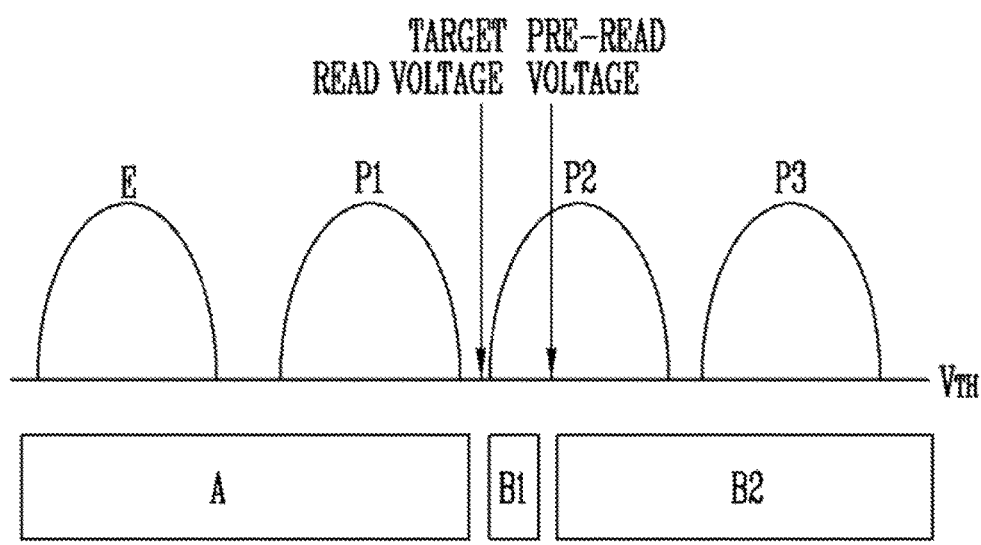
FIG. 12 is a diagram illustrating a read operation method according to an embodiment.

FIG. 12 is a diagram illustrating a read operation method according to an embodiment of the invention.

Referring to FIG. 12, a read operation may be performed based on a target read voltage and a pre-read voltage higher than the target read voltage. The target read voltage or the pre-read voltage may be a target threshold voltage by which a memory cell is determined as an on-cell or an off-cell during the read operation. Referring to FIG. 12, a target threshold voltage of a sensing operation based on the pre-read voltage may be greater than a target threshold voltage of a sensing operation based on the target read voltage.

Threshold voltages of the memory cells MC may be divided into three sections on the basis of the target read voltage and the pre-read voltage: A-section, B1-section and B2-section. Furthermore, the B-section shown in FIG. 7 may be divided into B1-section and B2-section on the basis of the pre-read voltage. The read operation may be performed to separate memory cells having threshold voltages included in A-section from memory cells having threshold voltages included in B1-section or B2-section. By performing the read operation, data '1' may be output with respect to the memory cells having the threshold voltages included in A-section, and data '0' may be output with respect to the memory cells having the threshold voltages included in B1-section or B2-section.

Different word line voltages may be used during the sensing operation corresponding to the target read voltage and the sensing operation corresponding to the pre-read voltage. A word line voltage during the sensing operation corresponding to the pre-read voltage may be greater than a word line voltage during the sensing operation corresponding to the target read voltage. Alternatively, the sensing operation corresponding to the target read voltage and the sensing operation corresponding to the pre-read voltage may be performed using the same word line voltage.

The pre-read voltage may be set such that the number of memory cells having threshold voltages included in B1-section may be much smaller than the number of memory cells having threshold voltages included in B2-section.

Figure 13:
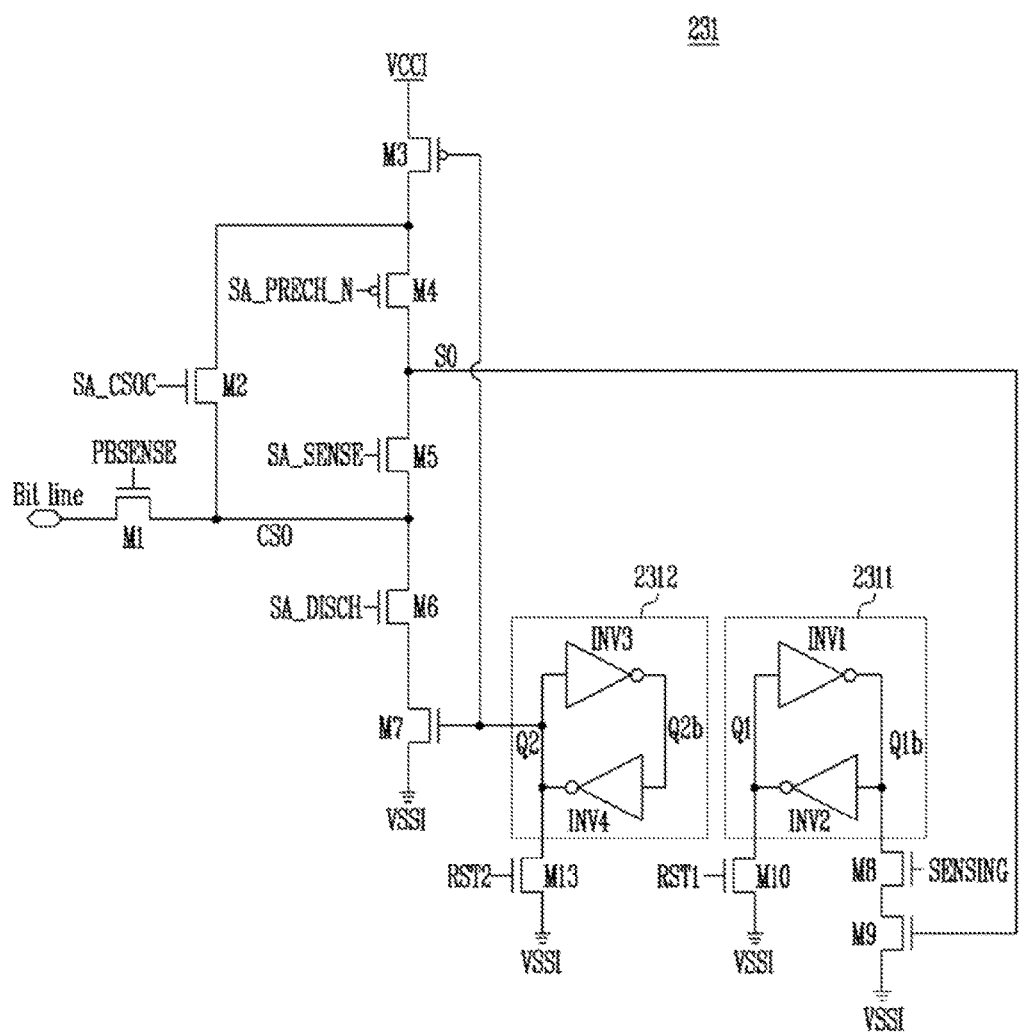
FIG. 13 is a diagram illustrating a page buffer according to an embodiment.
Figure 14:
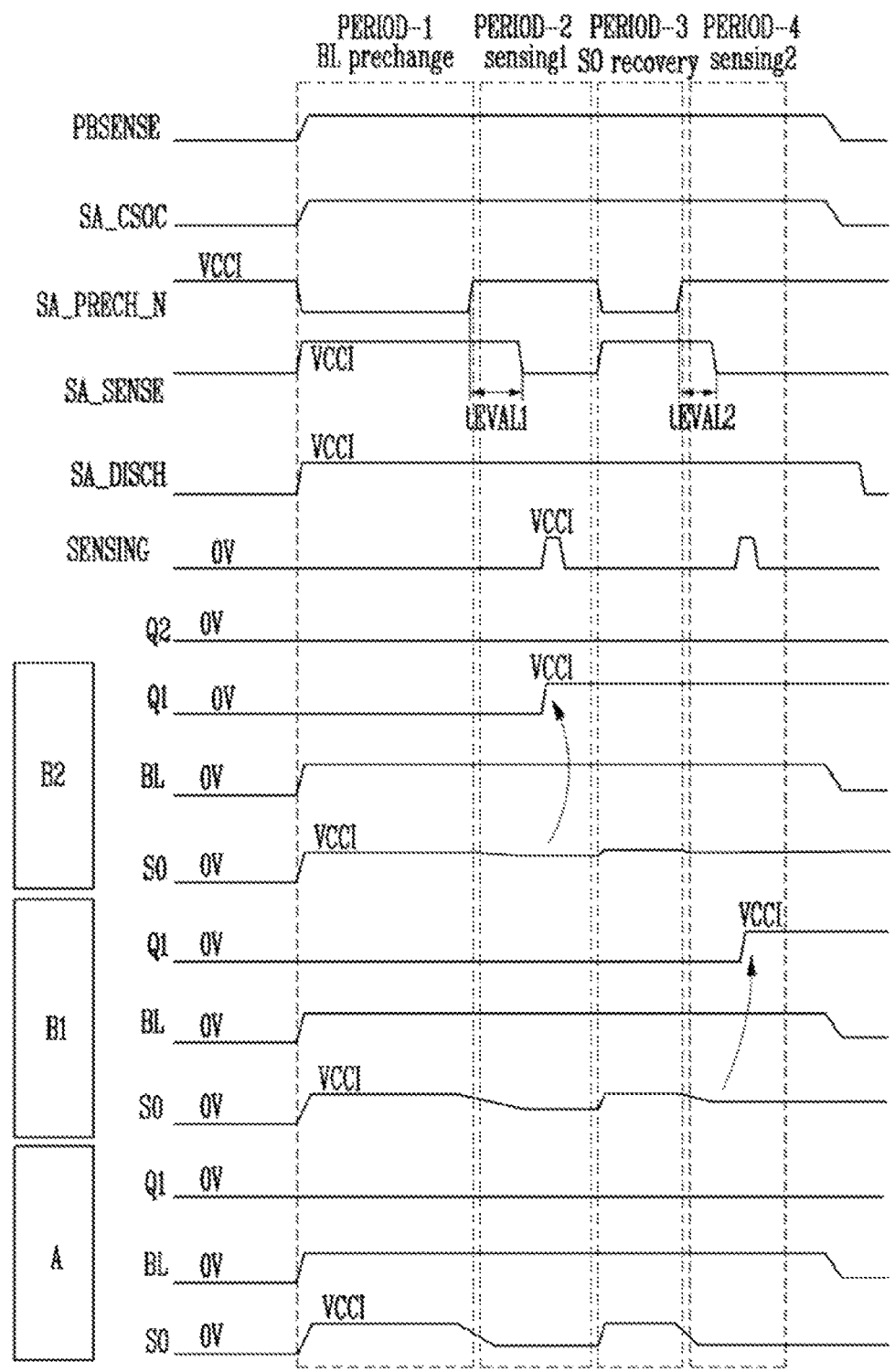
FIG. 14 is a timing diagram illustrating operations of a page buffer shown in FIG. 13 to perform a read operation shown in FIG. 12.

FIG. 13 is a diagram illustrating the page buffer 231 according to an embodiment of the invention. In addition, FIG. 14 is a timing diagram illustrating operations of the page buffer 231 for performing the read operation shown in FIG. 12.

Referring to FIG. 13, the page buffer 231 may be coupled to the memory cell MC through the bit line, and perform a BL precharge operation so that charges supplied from the internal power voltage VCCI may be charged to the bit line through the first to fifth transistors M1 to M5. The first transistor M1 may be controlled by the first sense signal PBSENSE, the second transistor M2 may be controlled by the first precharge signal SA_CSOC, and the third transistor M3 may be controlled by a second latch 2312. In addition, the fourth transistor M4 may be controlled by the second precharge signal SA_PRECH_N, and the fifth transistor M5 may be controlled by the second sense signal SA_SENSE.

The page buffer 231 may discharge the charges of the bit line to the internal ground voltage VSSI through the first transistor M1, the sixth transistor M6 and the seventh transistor M7. The sixth transistor M6 may be controlled by the first discharge signal SA_DISCH, and the seventh transistor M7 may be controlled by the second latch 2312.

The page buffer 231 may include the first latch 2311 including the first inverter INV1 and the second inverter INV2. In addition, the first latch 2311 may store a result of sensing the threshold voltage of the memory cell MC through the ninth transistor M9 coupled to the sense out node SO. The ninth transistor M9 may be an n-type MOS transistor and the sense out node SO may be coupled to a gate node of the ninth transistor M9. Therefore, when the memory cell MC has a low threshold voltage, the sense out node SO may be at a low level during the sensing operation to turn off the ninth transistor M9. When the memory cell MC has a high threshold voltage, the sense out node SO may be at a high level during the sensing operation to turn on the ninth transistor M9. The first latch 2311 may be coupled to the tenth transistor M10, and the tenth transistor M10 may be controlled by a first reset signal RST1.

The page buffer 231 may include the second latch 2312 including a third inverter INV3 and a fourth inverter INV4. The second latch 2312 may control a BL precharge operation by turning on or off the third transistor M3 through a second queue node Q2. The second latch 2312 may be coupled to the thirteenth transistor M13, and the transistor M13 may be controlled by a second reset signal RST2.

Each of the first and second inverters INV1 and INV2 included in the first latch 2311 and the third and fourth inverters INV3 and INV4 included in the second latch 2312 may be coupled to each of the internal power voltage VCCI and the internal ground voltage VSSI.

Referring to FIG. 14, the read operation shown in FIG. 12 may include a first sensing operation SENSING1 and a second sensing operation SENSING2. The first sensing operation SENSING1 may correspond to the sensing operation based on the pre-read voltage and the second sensing operation SENSING2 may correspond to the sensing operation based on the target read voltage, as shown in FIG. 12.

The first queue node Q1 may be set to a low level when the first reset signal RST1 is enabled before the read operation starts. In addition, the second queue node Q2 may be set to a low level when the second reset signal RST2 is enabled. The first queue bar node Q1b and the first queue node Q1 may have values inverted relative to each other. In addition, a second queue bar node Q2b and the second queue node Q2 may have values inverted relative to each other. When the read operation starts, the BL precharge operation BL PRECHARGE may be performed first. The BL precharge operation BL PRECHARGE may be controlled by the second latch 2312 shown in FIG. 13. During a BL precharge operation BL PRECHARGE, a value of the second queue node Q2 of the second latch 2312 may remain low to turn on the third transistor M3. In addition, the value stored in the second latch 2312 may remain the same during the first sensing operation SENSING1, a sense out recovery operation SO RECOVERY and the second sensing operation SENSING2, and be controlled by the threshold voltage of the memory cell. That is, a precharged bit line voltage during the BL precharge operation BL PRECHARGE, may not be reduced to a low level during the first sensing operation SENSING1, the sense out recovery operation SO RECOVERY and the second sensing operation SENSING2, and may maintain the precharged voltage level. Thus, a read time may be reduced by preventing an interference phenomenon caused by coupling between bit lines.

After the bit line precharge operation BL PRECHARGE ends, the first sensing operation SENSING1 corresponding to the sensing operation based on the pre-read voltage as shown in FIG. 12 may start. A first sense evaluation period tEVAL1 may start when the fourth transistor M4 is turned off, and the voltage of the sense out node SO may be changed on the basis of the threshold voltage of the memory cell MC. For example, when the threshold voltage of the memory cell is included in A-section shown in FIG. 12, the voltage of the sense out node SO may drastically drop to turn off the eighth transistor M8. In addition, when a threshold voltage of a memory cell is included in B1-section shown in FIG. 12, the voltage of the sense out node SO may slightly drop to turn off the eighth transistor M8. Lastly, when the threshold voltage of the memory cell is included in B2-section as shown in FIG. 12, the voltage of the sense out node SO may remain or slightly drop to a voltage by which the eighth transistor M8 is turned on.

The eighth transistor M8 may be turned on for a short time after the first sense evaluation period tEVAL1 ends since the fifth transistor M5 is turned off. As a result, the value stored in the first latch 2311 may be determined by the voltage of the sense out node SO. In other words, the eighth transistor M8 of the page buffer 231 corresponding to the memory cell having the threshold voltage included in A-section or B1-section as shown in FIG. 12 may be turned off, so that the value stored in the first latch 2311 may remain the same. Furthermore, the eighth transistor M8 of the page buffer 231 corresponding to the memory cell having the threshold voltage included in B2-section may be turned on, so that the value stored in the first latch 2311 may be inverted. As described above, the inverted value stored in the first latch 2311 may cause the internal power voltage VCCI and the internal ground voltage VSSI to be unstable. As a result, the unstable internal power voltage VCCI and the unstable internal ground voltage VSSI during the first sensing operation SENSING1 may result from the memory cells having threshold voltages included in B2-section.

After the first sensing operation SENSING1 ends, the fourth transistor M4 may be turned on again, and the sense out recovery operation SO RECOVERY may start. During the sense out recovery operation SO RECOVERY, the sense out node SO of each of the page buffers 231 may return to have the internal power voltage VCCI.

A capacitance value of the bit line may be much greater than that of the sense out node SO. Therefore, a period of the sense out recovery operation SO RECOVERY during which the voltage of the sense out node SO is charged to the internal power voltage VCCI may be much shorter than a period of a bit line precharge operation BL PRECHARGE during which the bit line is charged. That is, a bit line voltage set by the second latch 2312 during the bit line precharge operation BL PRECHARGE may maintain a constant level during the first sensing operation SENSING1, the sense out recovery operation SO RECOVERY and the second sensing operation SENSING2, thereby improving read performance.

After the sense out recovery operation SO RECOVERY ends, the fourth transistor M4 may be turned off again and the second sensing operation SENSING2 may start. The second sensing operation SENSING2 may be performed based on the target read voltage shown in FIG. 12. A word line voltage may vary during the first sensing operation SENSING1 and the second sensing operation SENSING2. The word line voltage during the second sensing operation SENSING2 may be lower than the word line voltage during the first sensing operation SENSING1. A second sense evaluation period tEVAL2 may be set to have the same duration as a first sense evaluation period tEVAL1.

When the read operation starts, the word line voltage may be set to a desired level during the bit line precharge operation BL PRECHARGE. In addition, the word line voltage set during the bit line precharge operation BL PRECHARGE may be maintained until the first sensing operation SENSING1 and the second sensing operation SENSING2 end. The second sense evaluation period tEVAL2 of the second sensing operation SENSING2 may be shorter than the first sense evaluation period tEVAL1 of the first sensing operation SENSING1. By maintaining the same word line voltage and changing the length of the sense evaluation period, the target threshold voltage of the sensing operation may be changed. With the same word line voltage, when the sense evaluation period is longer, the target threshold voltage may be higher.

The sense out node SO of the page buffer 231 corresponding to a memory cell having a threshold voltage included in B1-section or B2-section as shown in FIG. 12 may be set to have a voltage by which the eighth transistor M8 is turned on after the second sense evaluation period tEVAL2 ends. In addition, the sense out node SO of the page buffer 231 corresponding to a memory cell having a threshold voltage included in A-section as shown in FIG. 12 may be reduced to have a voltage by which the eighth transistor M8 is turned off.

As a result, the value stored in the first latch 2311 of the page buffer 231 corresponding to the memory cell having the threshold voltage included in 1B-section may be inverted by the second sensing operation SENSING2. The value stored in the first latch 2311 of the page buffer 231 corresponding to the memory cell having the threshold voltage included in A-section or B2-section may be maintained without being inverted by the second sensing operation SENSING2. Since the stored value of the first latch 2311 of the page buffer 231 corresponding to the memory cell having the threshold voltage included in B2-section is already inverted by the first sensing operation SENSING1, the stored value may not be further inverted by the second sensing operation SENSING2. As a result, the internal power voltage VCCI and the internal ground voltage VSSI may be unstable during the second sensing operation SENSING2 due to the memory cells having the threshold voltages included in B1-section.

The number of memory cells having threshold voltages included in B1-section shown in FIG. 12 may be much smaller than the number of memory cells having threshold voltages included in B-section as shown in FIG. 7. Therefore, the internal power voltage VCCI and the internal ground voltage VSSI may be much less unstable during the second sensing operation SENSING2 as shown in FIG. 14 than during the sensing operation as shown in FIG. 9.

In addition, the number of memory cells having threshold voltages included in 1B-section may be much smaller than the number of memory cells having threshold voltages included in B2-section. Therefore, internal power voltage VCCI and the internal ground voltage VSSI may be less unstable during the second sensing operation SENSING2 as shown in FIG. 14 than during the first sensing operation as shown in FIG. 9. The final data value of the read operation as shown in FIG. 12 may be determined by the second sensing operation SENSING2 corresponding to the target read voltage. Thus, the reliability of the second sensing operation SENSING2 may matter. In comparison with the read operation described above with reference to FIGS. 7 to 9, errors caused by the unstable internal power voltage VCCI and the unstable internal ground voltage VSSI may be reduced by the read operation described above with reference to FIGS. 12 to 14.

Figure 15:
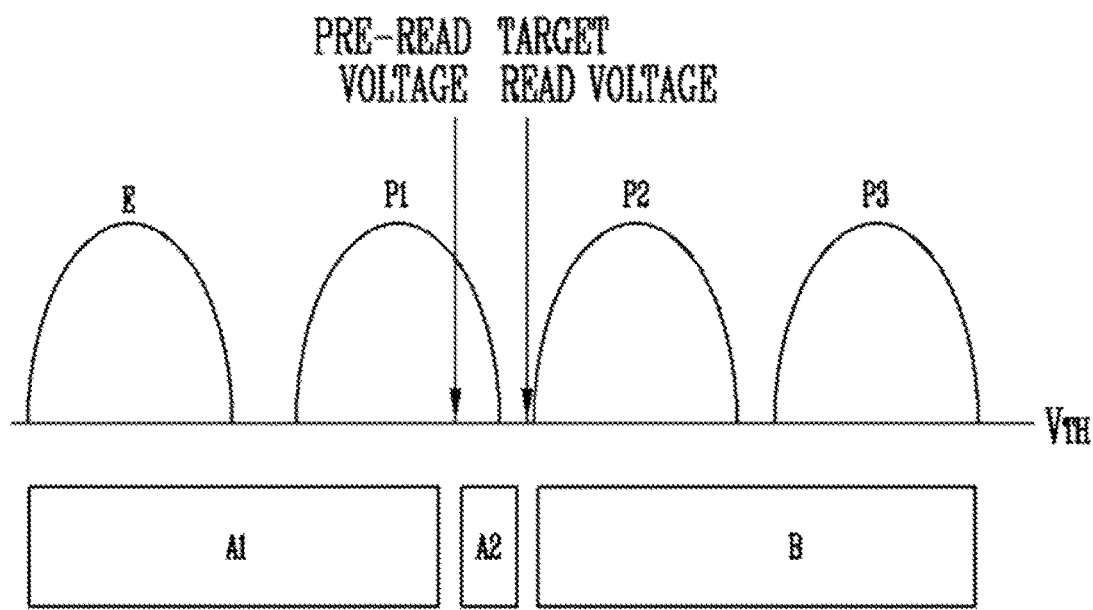
FIG. 15 is a diagram illustrating a read operation method according to another embodiment.

FIG. 15 is a diagram illustrating a read operation method according to another embodiment of the invention.

Referring to FIG. 15, a read operation may be performed based on a target read voltage and a pre-read voltage lower than the target read voltage. The target read voltage or the pre-read voltage may be a target threshold voltage by which a memory cell is determined as an on-cell or an off-cell during the read operation. Referring to FIG. 15, a target threshold voltage of a sensing operation based on the target read voltage may be greater than a target threshold voltage of a sensing operation based on the pre-read voltage.

Threshold voltages of the memory cells MC may be divided into three sections based on the target read voltage and the pre-read voltage: A1-section, A2-section and B-section. That is, A-section shown in FIG. 7 may be divided into A1-section and A2-section based on the pre-read voltage. The read operation may be performed to separate the memory cells having the threshold voltages included in A1-section or A2-section from the memory cells having the threshold voltages included in B-section. By performing the read operation, data '1' may be output with respect to the memory cells having the threshold voltages included in A1-section or A2-section, and data '0' may be output with respect to the memory cells having the threshold voltages included in B-section.

Different word line voltages may be used during the sensing operation corresponding to the target read voltage and the sensing operation corresponding to the pre-read voltage. The word line voltage during the sensing operation corresponding to the target read voltage may be greater than the word line voltage during the sensing operation corresponding to the pre-read voltage. Alternatively, the sensing operation corresponding to the target read voltage and the sensing operation corresponding to the pre-read voltage may be performed using the same word line voltage.

The pre-read voltage may be set such that the number of memory cells having threshold voltages included in A1-section may be much greater than the number of memory cells having threshold voltages included in A2-section.

Figure 16:
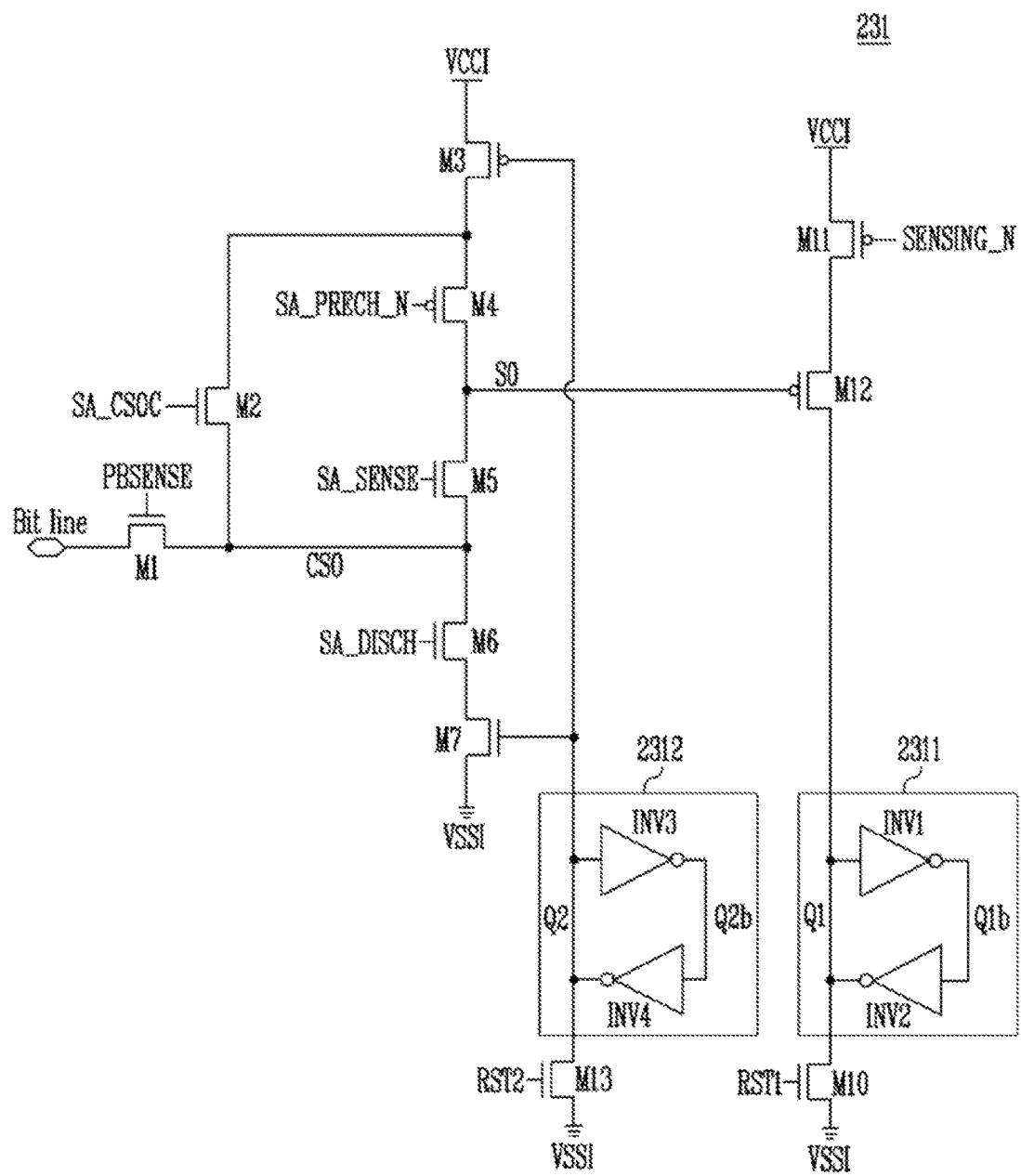
FIG. 16 is a diagram illustrating a page buffer according to another embodiment.
Figure 17:
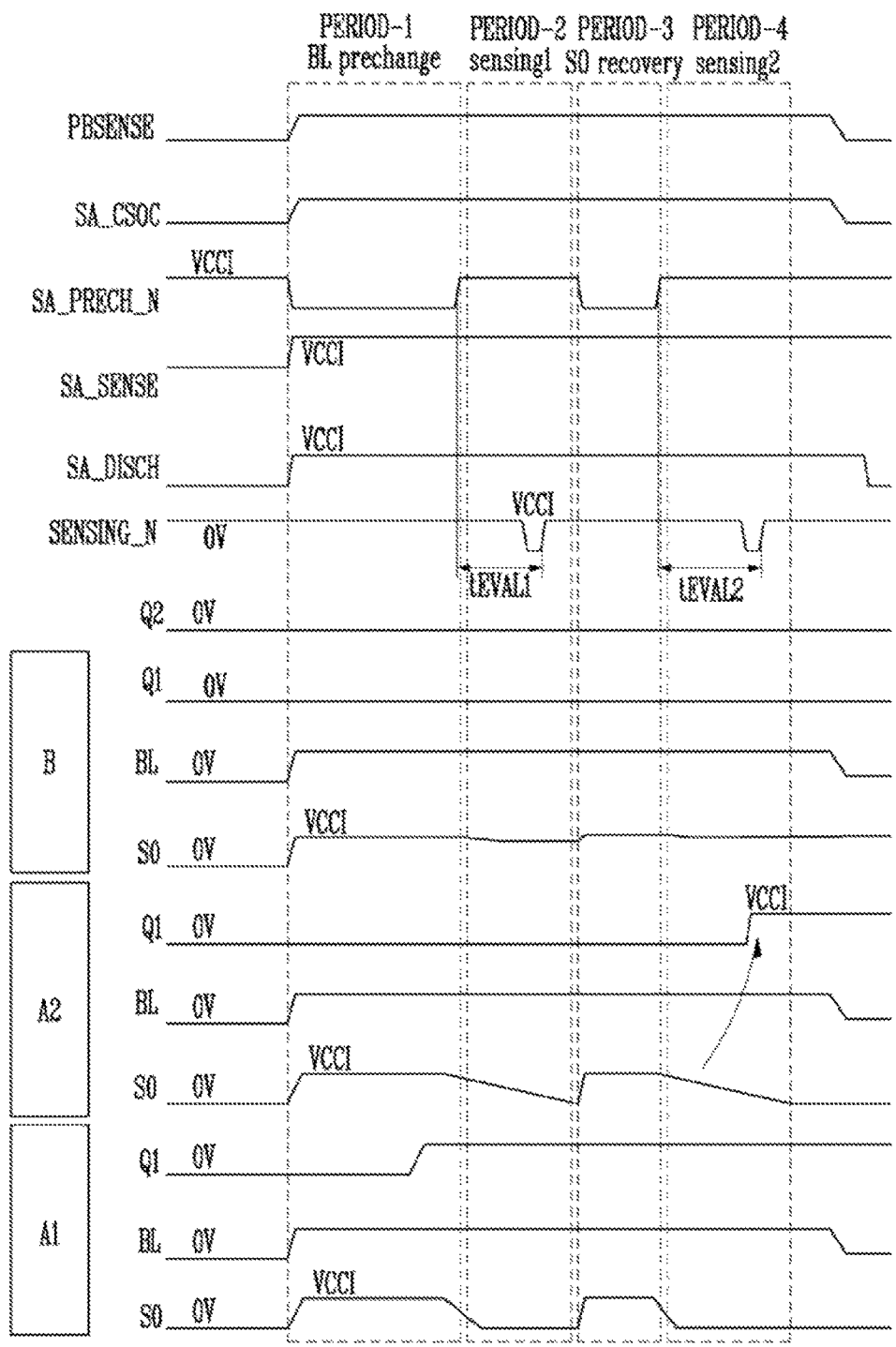
FIG. 17 is a timing diagram illustrating operations of a page buffer shown in FIG. 16 to perform a read operation shown in FIG. 15.

FIG. 16 is a diagram illustrating the page buffer 231 according to another embodiment of the invention. In addition, FIG. 17 is a timing diagram illustrating operations of the page buffer 231 for performing the read operation shown in FIG. 15.

Referring to FIG. 16, the page buffer 231 may be coupled to the memory cell MC through the bit line. The page buffer 231 may perform a BL precharge operation so that charges supplied from the internal power voltage VCCI may be charged to the bit line through the first to fifth transistors M1 to M5.

In addition, the page buffer 231 may discharge the charges of the bit line to the internal ground voltage VSSI through the first transistor M1, the sixth transistor M6 and the seventh transistor M7.

The page buffer 231 may include the first latch 2311 including the first inverter INV1 and the second inverter INV2. The first latch 2311 may store a result of sensing the threshold voltage of the memory cell MC through the twelfth transistor M12 coupled to the sense out node SO. The twelfth transistor M12 may be a p-type MOS transistor and the sense out node SO may be coupled to a gate node of the twelfth transistor M12. Therefore, when the threshold voltage of the memory cell MC is low, the sense out node SO may be at a low level during the sensing operation to turn on the twelfth transistor M12. When the threshold voltage of the memory cell MC is high, the sense out node SO may be at a high level during the sensing operation to turn off the twelfth transistor M12.

The page buffer 231 may include the second latch 2312 including the third inverter INV3 and the fourth inverter INV4. The second latch 2312 may control the BL precharge operation by turning on or off the third transistor M3 through the second queue node Q2.

Each of the first inverter INV1 and the second inverter INV2 included in the first latch 2311, and the third inverter INV3 and the fourth inverter INV4 included in the second latch 2312 may be coupled to the internal power voltage VCCI and the internal ground voltage VSSI.

Referring to FIG. 17, the read operation shown in FIG. 15 may include a first sensing operation SENSING1 and a second sensing operation SENSING2. The first sensing operation SENSING1 may correspond to the sensing operation based on the pre-read voltage and the second sensing operation SENSING2 may correspond to the sensing operation based on the target read voltage, as shown in FIG. 15.

The first queue node Q1 and the second queue node Q2 may maintain low voltages before a read operation is performed. When the read operation starts, a BL precharge operation BL PRECHARGE may be performed first. The BL precharge operation BL PRECHARGE may be controlled by the second latch 2312 shown in FIG. 16. During a BL precharge operation BL PRECHARGE, the second queue node Q2 of the second latch 2312 may maintain a low value to turn on the third transistor M3. In addition, the value stored in the second latch 2312 may be maintained at a predetermined value during the first sensing operation SENSING1, the sense out recovery operation SO RECOVERY and the second sensing operation SENSING2, and be controlled regardless of a threshold voltage of a memory cell. That is, a precharged bit line voltage during the BL precharge operation BL PRECHARGE may not drop to a low level and maintain the precharged voltage level during the first sensing operation SENSING1, the sense out recovery operation SO RECOVERY and the second sensing operation SENSING2. As a result, interference caused by coupling between bit lines may be prevented to reduce a read time.

After the BL precharge operation BL PRECHARGE is terminated, the first sensing operation SENSING1 corresponding to the sensing operation based on the pre-read voltage as shown in FIG. 15 may start. The fourth transistor M4 may be turned off, and the first sense evaluation period tEVAL1 may start. The voltage of the sense out node SO may be changed based on the threshold voltage of the memory cell MC during the first sense evaluation period tEVAL1. For example, when the threshold voltage of the memory cell MC is included in A1-section as shown in FIG. 15, the voltage of the sense out node SO may be reduced to turn on the twelfth transistor M12. When the threshold voltage of the memory cell MC is included in A2-section as shown in FIG. 15, the voltage of the sense out node SO may drop slightly or may not drop as to be maintained in order to turn off the twelfth transistor M12. When the threshold voltage of the memory cell MC is included in B-section as shown in FIG. 15, the voltage of the sense out node SO may not drop, or may slightly drop so as to be maintained at a voltage level by which the twelfth transistor M12 may be turned off.

The eleventh transistor M11 may be turned on after the first sense evaluation period tEVAL1 ends, or for a short period during the latter part of the first sense evaluation period tEVAL1. As a result, the value stored in the first latch 2311 may be determined by the voltage of the sense out node SO. The twelfth transistor M12 of the page buffer 231 corresponding to the memory cell having the threshold voltage included in A1-section shown in FIG. 15 may be turned on so that the value stored in the first latch 2311 may be inverted. In addition, the twelfth transistor M12 of the page buffer 231 corresponding to the memory cell having the threshold voltage included in A2-section or B-section shown in FIG. 15 may be turned off, so that the value stored in the first latch 2311 may be maintained. As described above, the inversion of the value stored in the first latch 2311 may cause the internal power voltage VCCI and the internal ground voltage VSSI to be unstable. As a result, the internal power voltage VCCI and the internal ground voltage VSSI may be unstable by the memory cells having the threshold voltages included in A1-section during the first sensing operation SENSING1.

After the first sensing operation SENSING1 is terminated, the fourth transistor M4 may be turned on again, and the sense out recovery operation SO RECOVERY may start. During the sense out recovery operation SO RECOVERY, the sense out node SO of each page buffer 231 may return to have the internal power voltage VCCI.

A capacitance value of the bit line may be much greater than that of the sense out node SO. Thus, a period of the sense out recovery operation SO RECOVERY during which the voltage of the sense out node SO is charged to the internal power voltage VCCI may be much shorter than a period of the bit line precharge operation BL PRECHARGE during which the bit line is charged. That is, the bit line voltage set by the second latch 2312 during the bit line precharge operation BL PRECHARGE may be maintained at a constant level during the first sensing operation SENSING1, the sense out recovery operation SO RECOVERY and the second sensing operation SENSING2, thereby improving read performance.

After the sense out recovery operation SO RECOVERY is terminated, the fourth transistor M4 may be turned off and the second sensing operation SENSING2 may start. The second sensing operation SENSING2 may be performed based on the target read voltage shown in FIG. 15. Different word line voltages may be used during the first sensing operation SENSING1 and the second sensing operation SENSING2. The word line voltage of the first sensing operation SENSING1 may be greater than that of the second sensing operation SENSING2. The second sense evaluation period tEVAL2 may be set to have the same duration as the first sense evaluation period tEVAL1.

When the read operation starts, the word line voltage may be set to a desired level during the bit line precharge operation BL PRECHARGE. In addition, the word line voltage set during the bit line precharge operation BL PRECHARGE may be maintained until the first sensing operation SENSING1 and the second sensing operation SENSING2 end. The second sense evaluation period tEVAL2 of the second sensing operation SENSING2 may be longer than the first sense evaluation period tEVAL1 of the first sensing operation SENSING1. The word line voltage may remain the same and the duration of the sense evaluation period may be changed, so that a target threshold voltage of the sensing operation may be changed. With the same word line voltage, when the sense evaluation period is longer, the target threshold voltage may be greater.

During the second sense evaluation period tEVAL2, the voltage of the sense out node SO of the page buffer 231 corresponding to the memory cell having the threshold voltage included in B-section shown in FIG. 15 which turns off the twelfth transistor M12 may be maintained. In addition, the voltage of the sense out node SO of the page buffer 231 corresponding to the memory cells having the threshold voltages included in A1-section and A2-section may be reduced to a voltage by which the twelfth transistor M12 may be turned on.

As a result, the value stored in the first latch 2311 of the page buffer 231 corresponding to the memory cell having the threshold voltage included in A2-section shown in FIG. 15 may be inverted by the second sensing operation SENSING2. Since the stored value of the first latch 2311 of the page buffer 231 corresponding to the memory cell having the threshold voltage included in A2-section shown in FIG. 15 is already inverted by the first sensing operation SENSING1, the stored value may not be further inverted by the second sensing operation SENSING2. As a result, the internal power voltage VCCI and the internal ground voltage VSSI may be unstable during the second sensing operation SENSING2 due to the memory cells included in A2-section as shown in FIG. 15.

The number of memory cells having threshold voltages included in the A2-section as shown in FIG. 15 may be much smaller than the number of memory cells having threshold voltages included in the A-section as shown in FIG. 7. Therefore, the internal power voltage VCCI and the internal ground voltage VSSI may be much less unstable during the second sensing operation SENSING2 as shown in FIG. 17 than during the sensing operation as shown in FIG. 11.

In addition, the number of memory cells having threshold voltages included in the A2-section may be much smaller than that of memory cells having threshold voltages included in the A1-section. Therefore, the internal power voltage VCCI and the internal ground voltage VSSI may be much less unstable during the second sensing operation SENSING2 than during the first sensing operation SENSING1 as shown in FIG. 14. The final data value of the read operation shown in FIG. 15 may be determined by the second sensing operation SENSING2 corresponding to the target read voltage as shown in FIG. 15. Therefore, the reliability of the second sensing operation SENSING2 may matter. The errors occurring in the read operation described with reference to FIGS. 15 to 17 due to the unstable internal power voltage VCCI and the internal ground voltage VSSI may be more preventable in comparison with the read operation described above with reference to FIGS. 7, 10, and 11.

Figure 18:
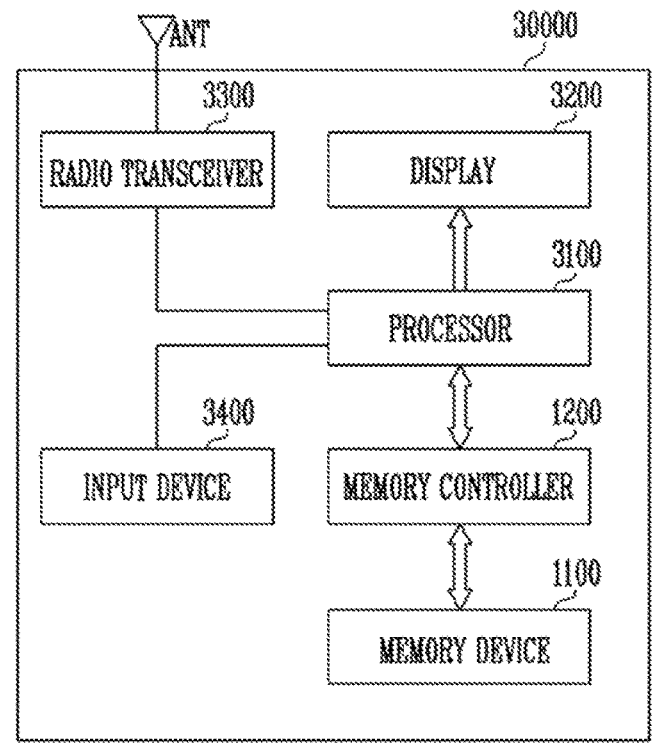
FIG. 18 is a diagram illustrating another embodiment of a memory system including a memory device shown in FIG. 2.

FIG. 18 is a diagram illustrating another embodiment of a memory system 30000 including the memory device 1100 shown in FIG. 2.

Referring to FIG. 18, the memory system 30000 may be provided as a cellular phone, a smart phone, a tablet PC, a personal digital assistant (PDA), or a radio communication device. The memory system 30000 may include the memory device 1100 and the memory controller 1200 capable of controlling the operations of the memory device 1100. The memory controller 1200 may control a data access operation of the memory device 1100, for example, a program operation, an erase operation, or a read operation, in response to control of a processor 3100.

In response to control of the memory controller 1200, data programmed into the memory device 1100 may be output through a display 3200.

A radio transceiver 3300 may transmit and receive a radio signal through an antenna ANT. For example, the radio transceiver 3300 may change the radio signal received through the antenna ANT into a signal which can be processed by the processor 3100. Therefore, the processor 3100 may process a signal output from the radio transceiver 3300 and transfer the processed signal to the memory controller 1200 or the display 3200. The memory controller 1200 may program the semiconductor memory device 1100 with the signal processed by the processor 3100.

In addition, the radio transceiver 3300 may change the signal output from the processor 3100 into a radio signal and output the radio signal to an external device through the antenna ANT. A control signal for controlling the operations of the processor 3100 or data to be processed by the processor 3100, may be input through an input device 3400. The input device 3400 may be provided as a pointing device, such as a touch pad or a computer mouse, a keypad, or a keyboard. The processor 3100 may control the operations of the display 3200 so that data output from the memory controller 1200, data output from the radio transceiver 3300, and data output from the input device 3400 may be output through the display 3200.

According to an embodiment, the memory controller 1200 capable of controlling the operations of the memory device 1100 may form a portion of the processor 3100, or may be formed as a separate chip from the processor 3100.

Figure 19:
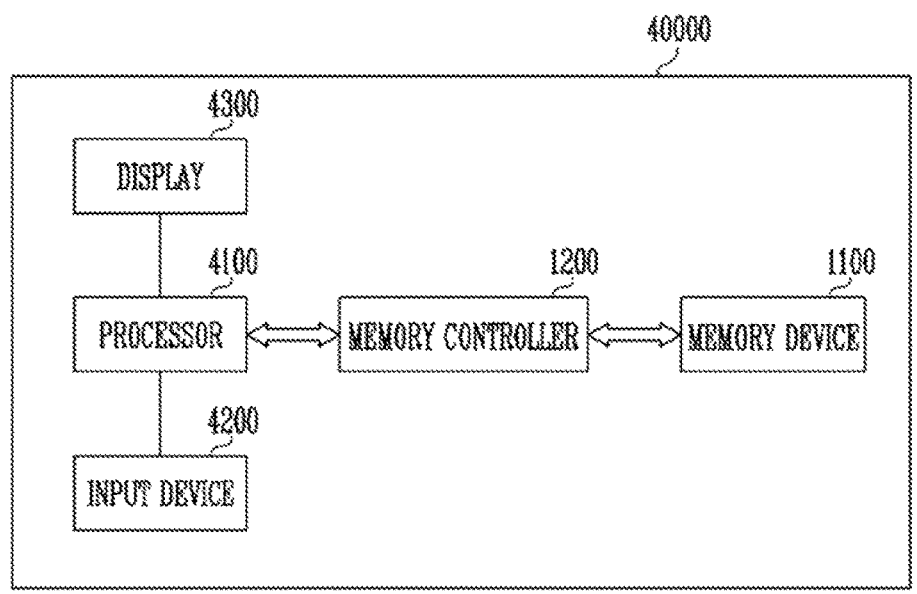
FIG. 19 is a diagram illustrating another embodiment of a memory system including a memory device shown in FIG. 2.

FIG. 19 is a diagram illustrating another embodiment of a memory system 40000 including the memory device 1100 shown in FIG. 2.

Referring to FIG. 19, the memory system 40000 may be provided as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

A processor 4100 may output data stored in the memory device 1100 through a display 4300 according to data input through an input device 4200. For example, the input device 4200 may be provided as a pointing device, such as a touch pad or a computer mouse, a keypad, or a keyboard.

The processor 4100 may control the general operations of the memory system 40000 and control the operations of the memory controller 1200. According to an embodiment, the memory controller 1200 capable of controlling the operations of the memory device 1100 may form a portion of the processor 4100, or may be formed as a separate chip from the processor 4100.

Figure 20:
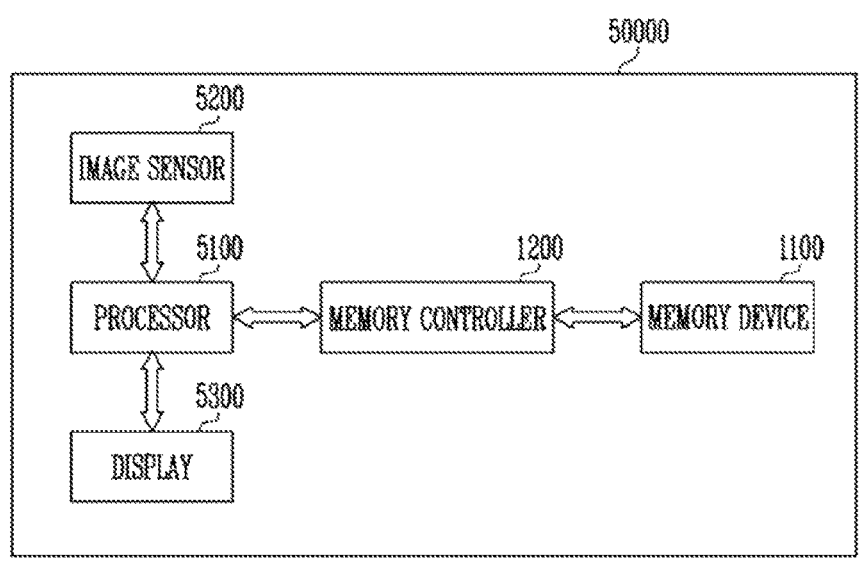
FIG. 20 is a diagram illustrating another embodiment of a memory system including a memory device shown in FIG. 2.

FIG. 20 is a diagram illustrating another embodiment of a memory system 50000 including the memory device 1100.

Referring to FIG. 20, the memory system 50000 may be provided as an image processing device, for example, a digital camera, a mobile phone attached with a digital camera, a smart phone attached with a digital camera, or a tablet PC attached with a digital camera.

The memory system 50000 may include the memory device 1100 and the memory controller 1200 capable of controlling a data processing operation of the memory device 1100, for example, a program operation, an erase operation or a read operation.

An image sensor 5200 of the memory system 50000 may convert an optical image into digital signals, and the converted digital signals may be transferred to the processor 5100 or the memory controller 1200. The processor 5100 may control the converted digital signals to be output through a display 5300, or to be stored in the semiconductor memory device 1100 through the memory controller 1200. In addition, data stored in the memory device 1100 may be output through the display 5300 in response to control of the processor 5100 or the memory controller 1200.

According to embodiments, the memory controller 1200 capable of controlling the operations of the memory device 1100 may form a portion of the processor 5100, or may be formed as a separate chip or a separate chip from the processor 5100.

Figure 21:
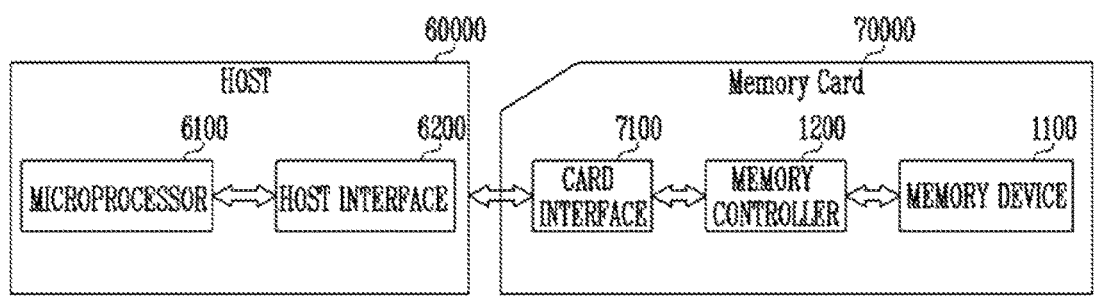
FIG. 21 is a diagram illustrating another embodiment including a memory system including a memory device shown in FIG. 2.

FIG. 21 is a diagram illustrating another embodiment of a memory system 70000 including the memory device 1200.

Referring to FIG. 21, the memory system 70000 may be provided as a memory card or a smart card. The memory system 70000 may include the memory device 1100, the memory controller 1200 and a card interface 7100.

The memory controller 1200 may exchange data between the semiconductor memory device 1100 and the card interface 7100. According to an embodiment, the card interface 7100 may be a secure digital (SD) card interface or a multi-media card (MMC) interface. However, the invention is not limited thereto.

The card interface 7100 may interface a data exchange between a host 60000 and the memory controller 1200 according to a protocol of the host 60000. According to an embodiment, the card interface 7100 may support a universal serial bus (USB) protocol and an InterChip (IC)-USB protocol. The card interface 7100 may refer to hardware supporting the protocol used by the host 60000, software in the hardware, or a signal transmission method.

When the memory system 70000 is connected to the host interface 6200 of the host 60000 such as a PC, a tablet PC, a digital camera, a digital audio player, a mobile phone, console video game hardware, or a digital set-top box, the host interface 6200 may perform data communications with the memory device 1100 through the card interface 7100 and the memory controller 1200 in response to control of the microprocessor 6100.

According to an embodiment, noise in an internal power voltage or an internal ground voltage may be reduced during a sensing operation of a memory device, so that the reliability of a read operation or a verify operation of the memory device may be improved.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A memory device, comprising:
   a plurality of memory cells;
   bit lines connected to the plurality of memory cells; and
   page buffers coupled to the plurality of memory cells through the bit lines, and performing a read operation on the plurality of memory cells,
   wherein each of the page buffers comprises:
   a first latch controlling a bit line precharge operation during the read operation; and
   a second latch storing a result of a first sensing operation and a result of a second sensing operation performed after the first sensing operation,
   wherein a value stored in the second latch is inverted when the result of the first sensing operation and the result of second sensing operation are different from each other during the second sensing operation,
   wherein the first latch maintains a voltage level of the bit line at a precharged voltage level during the first sensing operation and the second sensing operation.

2. The memory device of claim 1, wherein the value stored in the second latch is inverted when a memory cell is determined as an off-cell by the first sensing operation.

3. The memory device of claim 2, wherein a target threshold voltage of the first sensing operation is greater than a target threshold voltage of the second sensing operation.

4. The memory device of claim 3,
   wherein each of the first sensing operation and the second sensing operation includes a sense evaluation period, and
   wherein the sense evaluation period of the first sensing operation is longer than the sense evaluation period of the second sensing operation.

5. The memory device of claim 1, wherein the value stored in the second latch is inverted when a memory cell is determined as an on-cell by the first sensing operation.

6. The memory device of claim 5, wherein a target threshold voltage of the first sensing operation is lower than a target threshold voltage of the second sensing operation.

7. The memory device of claim 1, wherein a voltage of each of the bit lines during the read operation is maintained at a voltage set by the bit line precharge operation until the first sensing operation and the second sensing operation are terminated.

8. The memory device of claim 7,
   wherein the plurality of memory cells are commonly coupled to a word line, and wherein a voltage of the word line during the read operation is maintained at a voltage set during the bit line precharge operation until the first sensing operation and the second sensing operation are terminated.

9. The memory device of claim 8,
wherein each of the first sensing operation and the second sensing operation includes a sense evaluation period, and
wherein the sense evaluation period of the first sensing operation is different from the sense evaluation period of the second sensing operation.

10. A memory device, comprising:
a plurality of memory cells; and
page buffers performing a read operation on the plurality of memory cells,
wherein each of the page buffers includes:
a first latch controlling a bit line precharge operation during the read operation;
a second latch storing a result of a first sensing operation and a result of a second sensing operation subsequent to the first sensing operation during the read operation,
wherein a target threshold voltage of the first sensing operation is greater than a target threshold voltage of the second sensing operation, and
wherein the first latch maintains a voltage level of the bit line at a precharged voltage level during the first sensing operation and the second sensing operation.

11. The memory device of claim 10, wherein a value stored in the latch is inverted when the result of the first sensing operation and the result of the second sensing operation are different from each other during the second sensing operation.

12. The memory device of claim 11, wherein the value stored in the latch is inverted when a memory cell is determined as an off-cell during the first sensing operation.

13. The memory device of claim 11, wherein the value stored in the latch is maintained when the result of the first sensing operation and the result of the second sensing operation are the same as each other during the second sensing operation.

14. The memory device of claim 11,
wherein each of the page buffers includes a sense out node of which a voltage is varied according to a threshold voltage of a memory cell, and
wherein the sense out node is coupled to a gate node of an n-type MOS transistor of the latch.

15. A method for operating a memory device, the method comprising:
precharging a bit line coupled to a memory cell;
performing a first sensing operation on the memory cell and storing in a latch as a first value, a sensed value by the first sensing operation; and
performing a second sensing operation on the memory cell and storing in the latch as a second value, a sensed value by the second sensing operation,
wherein a value stored in the latch is inverted when the first value and the second value are different from each other during the second sensing operation, and
wherein a voltage level of the bit line is maintained at a precharged voltage level during the first sensing operation and the second sensing operation.

16. The method of claim 15, wherein a target threshold voltage of the first sensing operation is greater than a target threshold voltage of the second sensing operation.

17. The method of claim 16, wherein the value stored in the latch is inverted when the memory cell is determined as an off-cell during the first sensing operation.

18. The method of claim 17, wherein the value stored in the latch is maintained when the first value and the second value are the same as each other during the second sensing operation.

19. The method of claim 16, wherein a bit line voltage set during the precharging of the bit line is maintained at a constant level during the first sensing operation and the second sensing operation.

20. The method of claim 19, wherein a voltage of a word line coupled to the memory cell and set during the precharging of the bit line is maintained at a constant level during the first sensing operation and the second sensing operation.

* * * * *